United States Patent
Holden et al.

(10) Patent No.: US 12,031,779 B2
(45) Date of Patent: Jul. 9, 2024

(54) COOLING MODULE WITH LEAK DETECTOR AND RELATED SYSTEMS

(71) Applicant: CoolIT Systems, Inc., Calgary (CA)

(72) Inventors: Mike Holden, Calgary (CA); Seyed Kamaleddin Mostafavi Yazdi, Calgary (CA); Randy Kubik, Calgary (CA)

(73) Assignee: CoolIT Systems, Inc., Calgary (CA)

( * ) Notice: Subject to any disclaimer, the term of this patent is extended or adjusted under 35 U.S.C. 154(b) by 0 days.

(21) Appl. No.: 18/216,808

(22) Filed: Jun. 30, 2023

(65) Prior Publication Data

US 2023/0341198 A1 Oct. 26, 2023

Related U.S. Application Data

(63) Continuation of application No. 17/952,101, filed on Sep. 23, 2022, now Pat. No. 11,725,890, which is a
(Continued)

(51) Int. Cl.
*F28F 27/00* (2006.01)
*G01M 3/16* (2006.01)
*H05K 7/20* (2006.01)

(52) U.S. Cl.
CPC ............... *F28F 27/00* (2013.01); *G01M 3/16* (2013.01); *H05K 7/20254* (2013.01);
(Continued)

(58) Field of Classification Search
CPC ........ G01M 3/16; F28F 27/00; F28F 2265/16; H05K 7/20254; H05K 7/20272; H05K 7/20509
(Continued)

(56) References Cited

U.S. PATENT DOCUMENTS

| 3,073,385 A | 1/1963 | Peters |
| 3,481,393 A | 12/1969 | Chu |

(Continued)

FOREIGN PATENT DOCUMENTS

| CN | 102483242 A | 5/2012 |
| DE | 20 2012 002 974 U1 | 7/2012 |

(Continued)

OTHER PUBLICATIONS

Ellsworth, M.J. Jr. et al., "The Evolution of Water Cooling for IBM Large Server Systems: Back To the Future," IEEE, CoolIT Systems Inc. Exhibit 1017, pp. 1-9, (2008).
(Continued)

*Primary Examiner* — Jon T. Schermerhorn, Jr.
(74) *Attorney, Agent, or Firm* — Workman Nydegger

(57) ABSTRACT

In some respects, concepts disclosed herein generally concern systems, methods and components to detect a presence of a liquid externally of a desired primary flow path through a segment of a fluid circuit, e.g., throughout a cooling loop. Some disclosed concepts pertain to systems, methods, and components to direct seepage or leakage of a liquid coolant toward a lead-detection sensor. As but one example, some disclosed liquid-cooled heat exchangers incorporate a leak-detection sensor, which, in turn, can couple with a computing environment that monitors for detected leaks, and, responsive to an indication of a detected leak, invokes a task to control or to mitigate the detected leak.

1 Claim, 9 Drawing Sheets

Related U.S. Application Data continuation of application No. 16/851,021, filed on Apr. 16, 2020, now Pat. No. 11,473,860.

(60) Provisional application No. 62/838,457, filed on Apr. 25, 2019.

(52) U.S. Cl.
CPC ..... *H05K 7/20272* (2013.01); *H05K 7/20509* (2013.01); *F28F 2265/16* (2013.01)

(58) Field of Classification Search
USPC ....................................................... 165/11.1
See application file for complete search history.

(56) References Cited

U.S. PATENT DOCUMENTS

| | | |
|---|---|---|
| 3,817,321 A | 6/1974 | Von Cube et al. |
| 3,861,826 A | 1/1975 | Dean, Jr. |
| 3,939,328 A | 2/1976 | Davis |
| 4,139,330 A | 2/1979 | Neal |
| 4,181,610 A | 1/1980 | Shintani et al. |
| 4,340,111 A | 7/1982 | Skala |
| 4,345,643 A | 8/1982 | Dawson et al. |
| 4,450,472 A | 5/1984 | Tuckerman et al. |
| 4,520,298 A | 5/1985 | Abbondanti |
| 4,561,040 A | 12/1985 | Eastman et al. |
| 4,564,040 A | 1/1986 | Rudelick |
| 4,750,086 A | 6/1988 | Mittal |
| 4,758,926 A | 7/1988 | Herrell et al. |
| 4,768,581 A | 9/1988 | Gotwald et al. |
| 4,777,578 A | 10/1988 | Jahns |
| 4,898,153 A | 2/1990 | Sherwood |
| 4,909,315 A | 3/1990 | Nelson et al. |
| 4,940,085 A | 7/1990 | Nelson et al. |
| 5,016,090 A | 5/1991 | Galyon et al. |
| 5,070,936 A | 12/1991 | Carroll et al. |
| 5,099,311 A | 3/1992 | Bonde et al. |
| 5,142,214 A | 8/1992 | Purson et al. |
| 5,203,401 A | 4/1993 | Hamburgen et al. |
| 5,218,515 A | 6/1993 | Bernhardt |
| 5,265,670 A | 11/1993 | Zingher |
| 5,277,232 A | 1/1994 | Borsheim |
| 5,294,830 A | 3/1994 | Young et al. |
| 5,309,319 A | 5/1994 | Messina |
| 5,441,102 A | 8/1995 | Burward-Hoy |
| 5,453,641 A | 9/1995 | Mundinger et al. |
| 5,522,452 A | 6/1996 | Mizuno et al. |
| 5,535,818 A | 7/1996 | Fujisaki et al. |
| 5,592,363 A | 1/1997 | Atarashi et al. |
| 5,628,199 A | 5/1997 | Hoglund et al. |
| 5,636,653 A | 6/1997 | Titus |
| 5,646,824 A | 7/1997 | Ohashi et al. |
| 5,684,671 A | 11/1997 | Hobbs et al. |
| 5,727,618 A | 3/1998 | Mundinger et al. |
| 5,731,954 A | 3/1998 | Cheon |
| 5,823,249 A | 10/1998 | Batchelder |
| 5,835,347 A | 11/1998 | Chu |
| 5,841,634 A | 11/1998 | Visser |
| 5,864,464 A | 1/1999 | Lin |
| 5,875,637 A | 3/1999 | Paetow |
| 5,998,240 A | 12/1999 | Hamilton et al. |
| 6,019,165 A | 2/2000 | Batchelder |
| 6,035,655 A | 3/2000 | Hare et al. |
| 6,256,378 B1 | 7/2001 | Iggulden et al. |
| 6,327,145 B1 | 12/2001 | Lian et al. |
| 6,330,525 B1 | 12/2001 | Hays et al. |
| 6,361,287 B1 | 3/2002 | Hopper |
| 6,408,937 B1 | 6/2002 | Roy |
| 6,415,853 B1 | 7/2002 | Tao et al. |
| 6,415,860 B1 | 7/2002 | Kelly et al. |
| 6,447,270 B1 | 9/2002 | Schmidt et al. |
| 6,470,289 B1 | 10/2002 | Peters et al. |
| 6,679,315 B2 | 1/2004 | Cosley et al. |
| 6,702,002 B2 | 3/2004 | Wang |
| 6,748,755 B2 | 6/2004 | Kubo et al. |
| 6,769,258 B2 | 8/2004 | Pierson |
| 6,775,137 B2 | 8/2004 | Chu et al. |
| 6,792,373 B2 | 9/2004 | Tabor |
| 6,819,563 B1 | 11/2004 | Chu et al. |
| 6,827,128 B2 | 12/2004 | Philpott et al. |
| 6,883,347 B2 | 4/2005 | Ayub |
| 6,952,345 B2 | 10/2005 | Weber et al. |
| 6,970,355 B2 | 11/2005 | Ellsworth, Jr. et al. |
| 6,973,801 B1 | 12/2005 | Campbell et al. |
| 6,986,382 B2 | 1/2006 | Upadhya et al. |
| 6,988,534 B2 | 1/2006 | Kenny et al. |
| 6,993,421 B2 | 1/2006 | Pillar et al. |
| 7,000,684 B2 | 2/2006 | Kenny et al. |
| 7,007,506 B2 | 3/2006 | Kubo et al. |
| 7,012,807 B2 | 3/2006 | Chu et al. |
| 7,021,367 B2 | 4/2006 | Oikawa |
| 7,029,647 B2 | 4/2006 | Tonkovich et al. |
| 7,032,651 B2 | 4/2006 | Winslow et al. |
| 7,044,198 B2 | 5/2006 | Matsushima et al. |
| 7,055,581 B1 | 6/2006 | Roy |
| 7,057,893 B2 | 6/2006 | Nicolai et al. |
| 7,086,247 B2 | 8/2006 | Campbell et al. |
| 7,104,312 B2 | 9/2006 | Goodson et al. |
| 7,123,996 B2 | 10/2006 | Fukushima et al. |
| 7,124,811 B2 | 10/2006 | Crocker et al. |
| 7,131,486 B2 | 11/2006 | Goodson et al. |
| 7,143,816 B1 | 12/2006 | Ghosh et al. |
| 7,149,084 B2 | 12/2006 | Matsushima et al. |
| 7,156,159 B2 | 1/2007 | Lovette et al. |
| 7,190,580 B2 | 3/2007 | Bezama et al. |
| 7,201,217 B2 | 4/2007 | Johnson et al. |
| 7,206,203 B2 | 4/2007 | Campbell et al. |
| 7,209,355 B2 | 4/2007 | Koga et al. |
| 7,221,270 B2 | 5/2007 | Chen et al. |
| 7,248,006 B2 | 7/2007 | Bailey et al. |
| 7,259,963 B2 | 8/2007 | Chang et al. |
| 7,264,359 B2 | 9/2007 | Kawahara et al. |
| 7,274,566 B2 | 9/2007 | Campbell et al. |
| 7,278,273 B1 | 10/2007 | Whitted et al. |
| 7,301,771 B2 | 11/2007 | Hata et al. |
| 7,315,448 B1 | 1/2008 | Bash et al. |
| 7,318,322 B2 | 1/2008 | Ota et al. |
| 7,331,378 B2 | 2/2008 | Bhatti et al. |
| 7,360,582 B2 | 4/2008 | Olesen |
| 7,397,661 B2 | 7/2008 | Campbell et al. |
| 7,405,935 B1 | 7/2008 | Carey |
| 7,436,666 B1 | 10/2008 | Konshak |
| 7,455,103 B2 | 11/2008 | Sato et al. |
| 7,466,549 B2 | 12/2008 | Dorrich et al. |
| 7,466,553 B2 | 12/2008 | Hamman |
| 7,484,530 B2 | 2/2009 | Harvey et al. |
| 7,486,513 B2 | 2/2009 | Hall et al. |
| 7,527,085 B2 | 5/2009 | Iijima et al. |
| 7,564,208 B2 | 7/2009 | Bailey et al. |
| 7,591,302 B1 | 9/2009 | Lenehan et al. |
| 7,599,184 B2 | 10/2009 | Upadhya et al. |
| 7,639,499 B1 | 12/2009 | Campbell et al. |
| 7,688,589 B2 | 3/2010 | Chiang |
| 7,757,506 B2 | 7/2010 | Ellsworth, Jr. et al. |
| 7,762,314 B2 | 7/2010 | Campbell et al. |
| 7,791,882 B2 | 9/2010 | Chu et al. |
| 7,806,168 B2 | 10/2010 | Upadhya et al. |
| 7,905,106 B2 | 3/2011 | Attlesey |
| 7,925,746 B1 | 4/2011 | Melton |
| 7,944,694 B2 | 5/2011 | Campbell et al. |
| 7,957,144 B2 | 6/2011 | Goettert et al. |
| 7,961,465 B2 | 6/2011 | Goldrian et al. |
| 7,969,727 B2 | 6/2011 | Tozer et al. |
| 7,971,632 B2 | 7/2011 | Eriksen |
| 7,978,472 B2 | 7/2011 | Campbell et al. |
| 8,051,898 B2 | 11/2011 | Chiang |
| 8,066,057 B2 | 11/2011 | Olesen |
| 8,240,362 B2 | 8/2012 | Eriksen |
| 8,245,764 B2 | 8/2012 | Eriksen |
| 8,250,879 B2 | 8/2012 | MacBain et al. |
| 8,427,831 B2 | 4/2013 | Wei |
| 8,437,129 B2 | 5/2013 | Tung et al. |
| 8,441,789 B2 | 5/2013 | Wu et al. |

(56) References Cited

U.S. PATENT DOCUMENTS

| | | |
|---|---|---|
| 8,493,735 B2 | 7/2013 | Iijima |
| 8,493,738 B2 | 7/2013 | Chainer et al. |
| 8,499,761 B2 | 8/2013 | Jorczak et al. |
| 8,631,860 B2 | 1/2014 | Tang et al. |
| 8,687,364 B2 | 4/2014 | Chainer et al. |
| 8,724,315 B2 | 5/2014 | Branton |
| 8,746,330 B2 | 6/2014 | Lyon |
| 9,052,252 B2 | 6/2015 | Lyon et al. |
| 9,057,567 B2 | 6/2015 | Lyon |
| 9,215,832 B2 | 12/2015 | Chang et al. |
| 9,453,691 B2 | 9/2016 | Lyon |
| 9,496,200 B2 | 11/2016 | Lyon et al. |
| 9,603,284 B2 | 3/2017 | Lyon |
| 9,723,745 B2 | 8/2017 | Qi et al. |
| 9,733,681 B2 | 8/2017 | Eriksen |
| 10,335,230 B2 | 7/2019 | Willyard et al. |
| 10,364,809 B2 | 7/2019 | Lyon et al. |
| 10,365,667 B2 | 7/2019 | Lyon et al. |
| 2002/0070007 A1 | 6/2002 | Calaman et al. |
| 2002/0153885 A1 | 10/2002 | Blossfeld |
| 2002/0189790 A1 | 12/2002 | Wong |
| 2003/0019234 A1 | 1/2003 | Wayburn et al. |
| 2003/0070792 A1 | 4/2003 | Tanaka et al. |
| 2003/0085028 A1 | 5/2003 | Galtz |
| 2003/0151130 A1 | 8/2003 | Cheon |
| 2003/0173839 A1 | 9/2003 | Torii et al. |
| 2003/0230400 A1 | 12/2003 | McCordic et al. |
| 2004/0008483 A1 | 1/2004 | Cheon |
| 2004/0016241 A1 | 1/2004 | Street et al. |
| 2004/0040695 A1 | 3/2004 | Chesser et al. |
| 2004/0042171 A1 | 3/2004 | Takamatsu et al. |
| 2004/0042172 A1 | 3/2004 | Kusaka et al. |
| 2004/0057211 A1 | 3/2004 | Kondo et al. |
| 2004/0100770 A1 | 5/2004 | Chu et al. |
| 2004/0104010 A1 | 6/2004 | Kenny et al. |
| 2004/0104012 A1 | 6/2004 | Zhou et al. |
| 2004/0104022 A1 | 6/2004 | Kenny et al. |
| 2004/0112585 A1 | 6/2004 | Goodson et al. |
| 2004/0123614 A1 | 7/2004 | Stewart |
| 2004/0160741 A1 | 8/2004 | Moss et al. |
| 2004/0182548 A1 | 9/2004 | Lovette et al. |
| 2004/0182560 A1 | 9/2004 | Kenny et al. |
| 2004/0188066 A1 | 9/2004 | Upadhya et al. |
| 2004/0188069 A1 | 9/2004 | Tomioka et al. |
| 2004/0206477 A1 | 10/2004 | Kenny et al. |
| 2004/0221604 A1 | 11/2004 | Ota et al. |
| 2004/0240179 A1 | 12/2004 | Koga et al. |
| 2005/0111187 A1 | 2/2005 | Berens et al. |
| 2005/0069432 A1 | 3/2005 | Tomioka |
| 2005/0126747 A1 | 6/2005 | Chu et al. |
| 2005/0128705 A1 | 6/2005 | Chu et al. |
| 2005/0178531 A1 | 8/2005 | Huang et al. |
| 2005/0180107 A1 | 8/2005 | Naganawa et al. |
| 2005/0205241 A1 | 9/2005 | Goodson et al. |
| 2005/0211417 A1 | 9/2005 | Upadhya et al. |
| 2005/0241809 A1 | 11/2005 | Tomioka et al. |
| 2005/0259397 A1 | 11/2005 | Bash et al. |
| 2005/0269061 A1 | 12/2005 | Brewer et al. |
| 2006/0002080 A1 | 1/2006 | Leija et al. |
| 2006/0002088 A1 | 1/2006 | Bezama et al. |
| 2006/0011329 A1 | 1/2006 | Wang et al. |
| 2006/0094347 A1 | 5/2006 | Tracy et al. |
| 2006/0096738 A1 | 5/2006 | Kang et al. |
| 2006/0096740 A1 | 5/2006 | Zheng |
| 2006/0096743 A1 | 5/2006 | Lee et al. |
| 2006/0137863 A1 | 6/2006 | Lee et al. |
| 2006/0143439 A1 | 6/2006 | Arumugam et al. |
| 2006/0162903 A1 | 7/2006 | Bhatti et al. |
| 2006/0171801 A1 | 8/2006 | Manabe et al. |
| 2006/0185829 A1* | 8/2006 | Duan .................... H01L 23/473 |
| | | 257/E23.098 |
| 2006/0185830 A1 | 8/2006 | Duan |
| 2006/0187638 A1 | 8/2006 | Vinson et al. |
| 2006/0225867 A1 | 10/2006 | Park et al. |
| 2006/0231238 A1 | 10/2006 | Ball, Jr. |
| 2006/0254755 A1 | 11/2006 | Chen et al. |
| 2007/0029069 A1 | 2/2007 | Duan |
| 2007/0034356 A1 | 2/2007 | Kenny et al. |
| 2007/0039719 A1 | 2/2007 | Eriksen |
| 2007/0095512 A1 | 5/2007 | Chen et al. |
| 2007/0107886 A1 | 5/2007 | Chen |
| 2007/0125526 A1 | 6/2007 | Satou et al. |
| 2007/0131396 A1 | 6/2007 | Yu et al. |
| 2007/0163750 A1 | 7/2007 | Bhatti et al. |
| 2007/0193724 A1 | 8/2007 | Lin |
| 2007/0227704 A1 | 10/2007 | Nagai et al. |
| 2007/0227710 A1 | 10/2007 | Belady et al. |
| 2007/0256957 A1 | 11/2007 | Herrmann et al. |
| 2007/0272314 A1 | 11/2007 | Packham |
| 2007/0272392 A1 | 11/2007 | Ghosh et al. |
| 2007/0297136 A1 | 12/2007 | Konshak |
| 2008/0041792 A1 | 2/2008 | Crnkovich et al. |
| 2008/0053641 A1 | 3/2008 | Lai et al. |
| 2008/0128114 A1 | 6/2008 | Lai et al. |
| 2008/0165499 A1 | 7/2008 | Campbell et al. |
| 2008/0179045 A1 | 7/2008 | Hu et al. |
| 2008/0205003 A1 | 8/2008 | Belady |
| 2008/0225478 A1 | 9/2008 | Goettert et al. |
| 2008/0266726 A1 | 10/2008 | Murakami et al. |
| 2008/0288124 A1 | 11/2008 | Huang |
| 2008/0301941 A1 | 12/2008 | Anderson, Jr. et al. |
| 2008/0304236 A1 | 12/2008 | Murakami et al. |
| 2008/0314367 A1 | 12/2008 | Goulette et al. |
| 2009/0071625 A1 | 3/2009 | Lyon |
| 2009/0101315 A1 | 4/2009 | Cheng |
| 2009/0120622 A1 | 5/2009 | Koch |
| 2009/0139698 A1 | 6/2009 | Robinson |
| 2009/0154096 A1 | 6/2009 | Iyengar et al. |
| 2009/0228893 A1 | 9/2009 | Behrendt et al. |
| 2009/0306833 A1 | 12/2009 | Vinson et al. |
| 2009/0322543 A1 | 12/2009 | Crnkovich et al. |
| 2010/0012294 A1 | 1/2010 | Bezama et al. |
| 2010/0032142 A1 | 2/2010 | Copeland et al. |
| 2010/0065355 A1 | 3/2010 | Reddy |
| 2010/0085708 A1 | 4/2010 | Martin et al. |
| 2010/0101765 A1 | 4/2010 | Campbell et al. |
| 2010/0103619 A1 | 4/2010 | Rafai-ahmed et al. |
| 2010/0103620 A1 | 4/2010 | Campbell et al. |
| 2010/0139887 A1 | 6/2010 | Slessman |
| 2010/0179695 A1 | 7/2010 | Collins et al. |
| 2010/0182809 A1 | 7/2010 | Cullinane et al. |
| 2010/0206869 A1 | 8/2010 | Nelson et al. |
| 2010/0211669 A1 | 8/2010 | Dalgas et al. |
| 2010/0324962 A1 | 12/2010 | Nesler et al. |
| 2010/0326634 A1 | 12/2010 | Eriksen |
| 2011/0084839 A1 | 4/2011 | Groth et al. |
| 2011/0100045 A1 | 5/2011 | Carlson |
| 2011/0100618 A1 | 5/2011 | Carlson |
| 2011/0115223 A1 | 5/2011 | Stahlkopf et al. |
| 2011/0127027 A1 | 6/2011 | Kashirajima et al. |
| 2011/0154842 A1 | 6/2011 | Heydari et al. |
| 2011/0168379 A1 | 7/2011 | Morgan et al. |
| 2011/0174001 A1 | 7/2011 | Carlson et al. |
| 2011/0175498 A1 | 7/2011 | Bash et al. |
| 2011/0303394 A1 | 12/2011 | Branton |
| 2011/0313576 A1 | 12/2011 | Nicewonger |
| 2011/0317367 A1 | 12/2011 | Campbell et al. |
| 2012/0103009 A1 | 5/2012 | Ding et al. |
| 2012/0147553 A1 | 6/2012 | Eriksen |
| 2012/0152498 A1* | 6/2012 | Lyon .................... H01L 23/473 |
| | | 165/104.19 |
| 2012/0175094 A1 | 7/2012 | Rice |
| 2012/0176745 A1 | 7/2012 | Helberg et al. |
| 2012/0186790 A1 | 7/2012 | Delia et al. |
| 2012/0271567 A1 | 10/2012 | Da Pont et al. |
| 2012/0273159 A1 | 11/2012 | Eriksen |
| 2013/0025818 A1 | 1/2013 | Lyon et al. |
| 2013/0107453 A1 | 5/2013 | Chainer et al. |
| 2013/0184927 A1 | 7/2013 | Daniel et al. |
| 2013/0203032 A1 | 8/2013 | Bardsley et al. |
| 2013/0206359 A1* | 8/2013 | Bertilsson ............. G01M 3/188 |
| | | 165/166 |
| 2013/0277008 A1 | 10/2013 | Ishikura et al. |
| 2013/0288630 A1 | 10/2013 | Suzuki |

(56) References Cited

U.S. PATENT DOCUMENTS

| | | |
|---|---|---|
| 2013/0340995 A1 | 12/2013 | David et al. |
| 2014/0069111 A1 | 3/2014 | Campbell et al. |
| 2014/0103950 A1 | 4/2014 | Janitch |
| 2014/0126147 A1 | 5/2014 | CChen |
| 2014/0147289 A1 | 5/2014 | Tian et al. |
| 2014/0158326 A1 | 6/2014 | Lyon |
| 2014/0186156 A1 | 7/2014 | Lai et al. |
| 2014/0245708 A1 | 9/2014 | Kawabe et al. |
| 2014/0251582 A1 | 9/2014 | Lyon |
| 2014/0262180 A1 | 9/2014 | Lyon et al. |
| 2014/0266744 A1 | 9/2014 | Lyon et al. |
| 2014/0332195 A1 | 11/2014 | Liverman |
| 2015/0083368 A1 | 3/2015 | Lyon |
| 2015/0108934 A1 | 4/2015 | Wong et al. |
| 2015/0166362 A1 | 6/2015 | Govindan et al. |
| 2015/0168474 A1 | 6/2015 | Yoshioka et al. |
| 2015/0176931 A1 | 6/2015 | Aeberhard et al. |
| 2015/0355630 A1 | 12/2015 | Cader et al. |
| 2016/0281704 A1 | 9/2016 | Lyon et al. |
| 2016/0290216 A1 | 10/2016 | Katragadda et al. |
| 2016/0377355 A1 | 12/2016 | Lyon |
| 2017/0030228 A1 | 2/2017 | Jordan, Jr. et al. |
| 2017/0064874 A1 | 3/2017 | Lyon et al. |
| 2017/0196116 A1 | 7/2017 | Lyon |
| 2019/0039437 A1 | 2/2019 | Jentz et al. |
| 2019/0116694 A1 | 4/2019 | Lyon et al. |
| 2019/0353370 A1 | 11/2019 | Hern et al. |
| 2019/0354121 A1 | 11/2019 | Lyon et al. |
| 2019/0368832 A1* | 12/2019 | Huang ................. G06F 1/20 |
| 2020/0004156 A1* | 1/2020 | Hsieh ............ H01L 21/67288 |
| 2020/0025641 A1* | 1/2020 | Long ............... H05K 7/20254 |

FOREIGN PATENT DOCUMENTS

| | | |
|---|---|---|
| EP | 1 808 892 A2 | 7/2007 |
| JP | 61-32449 A | 2/1986 |
| JP | H03-117443 | 1/1991 |
| JP | 06-120387 A | 4/1994 |
| JP | 7-183678 A | 7/1995 |
| JP | 10-173114 A | 6/1998 |
| JP | 2001-255027 A | 9/2001 |
| JP | 2002-151638 A | 5/2002 |
| JP | 2003-243581 A | 8/2003 |
| JP | 09292099 | 10/2004 |
| JP | 2005-351600 A | 12/2005 |
| JP | 2007-180505 A | 7/2007 |
| JP | 2007-227902 A | 9/2007 |
| JP | 2007-531991 A | 11/2007 |
| JP | 2008-140879 A | 6/2008 |
| JP | 2009-529621 A | 8/2009 |
| JP | 2011-114206 A | 6/2011 |
| JP | 3179086 U | 10/2012 |
| TW | M273031 U | 8/2005 |
| TW | M298733 U | 10/2006 |
| TW | I266039 B | 11/2006 |
| TW | 201305522 A1 | 2/2013 |
| TW | 201320883 A | 5/2013 |
| TW | 201441626 A | 11/2014 |
| TW | M587771 | 12/2019 |
| WO | 01/65900 A1 | 9/2001 |
| WO | 03/055055 A1 | 7/2003 |
| WO | 2005/017468 A2 | 2/2005 |
| WO | 2005/096377 A1 | 10/2005 |
| WO | 2006/052317 A2 | 5/2006 |
| WO | 2006119761 | 11/2006 |
| WO | 2007/029253 A2 | 3/2007 |
| WO | 2014/141162 A1 | 9/2014 |

OTHER PUBLICATIONS

Ellsworth, M.J. Jr. P.E., "Thermal Design and Implementation of Robust Liquid Cooling Systems for High Performance Computer Systems," Systems and Technology Group, IBM, InterPACK '11, dated Jul. 6-8, 2011, pp. 1-64.

Kandlikar, S.G., "High Flux Heat Removal with Microchannels. A Roadmap of Challenges and Opportunities," Heat Transfer Engineering. vol. 26 No. 8 : 5-14, (2005), pp. 5-14.

Knight, R.W., et al., "Heat Sink Optimization with Application to Microchannels," IEEE Transactions on Components, Hybrids, and Manufacturing Technology, vol. 15, No. 5, Oct. 1992, pp. 832-842.

Merriam-webster definition of beveled, dated Jan. 26, 2016, retrieved from internet URL: http://www.merriam-webster.com/dictionary/beveled, pp. 1-4.

Schmidt, R.R., "Liquid Cooling is Back," Electronics Cooling Magazine, Published Aug. 1, 2005, Retrieved from the Internet URL: https://www.electronics-cooling.com/2005/08/liquid-cooling-is-back/, on Apr. 30, 2014, pp. 1-7.

Steinke, M., and Kandlikar, S.G., "Single-Phase Heat Transfer Enhancement Techniques In Microchannel and Minichannels Flows," Microchannels and Minichannels—2004, published on Jun. 17-19, 2004, Rochaster, New York, pp. 1-8.

Torres, G., "CoolIT Water-Cooling Products," Published Jan. 14, 2008, Retrieved from Internet URL: http://www.hardwaresecrets.com/coolit-water-cooling-products/3/, on Apr. 24, 2014, pp. 1-9.

Vertal, L., "Water Cooling Comes of Age, Again," Asetek Data Center Liquid Cooling, Published on Oct. 11, 2013, Retrieved from the Internet URL: htt5s://www.asetek.com/press-room/blog/2013/water-cooling-comes-of-age-again/, on Nov. 9, 2015, pp. 1-4.

Examination Report in European Patent Application No. 07075014.6, dated Mar. 11, 2011.

Requirement Restriction for U.S. Appl. No. 12/189,476, dated Jan. 24, 2012.

Non-Final Office Action for U.S. Appl. No. 12/189,476, dated Apr. 13, 2012.

English translation of Office Action for Japanese Application No. 2012-002117, dated May 7, 2012.

Final Office Action for U.S. Appl. No. 12/189,476, dated Jan. 7, 2013.

English translation of Technical Opinion for Japanese Utility Model Application No. 2012-002117, dted Jan. 10, 2013 (Registration No. 3179086).

English translation of Second Technical Opinion for Japanese Utility Model Application No. 2012-002117 dated Jul. 19, 2013 (Registration No. 3179086).

English translation of Chinese-language Search and Examination Reports for Taiwan Patent Application No. 101110072 dated Apr. 9, 2014.

Notice of Allowance for U.S. Appl. No. 12/189,476, dated Apr. 28, 2014.

Restriction Requirement for U.S. Appl. No. 14/183,443, dated May 22, 2014.

Restriction Requirement for U.S. Appl. No. 14/210,165, dated Jun. 12, 2014.

Restriction Requirement for U.S. Appl. No. 14/283,163, dated Jun. 13, 2014.

International Search Report and Written Opinion for PCT Application No. PCT/IB2014/059768, dated Jul. 9, 2014.

Petition for Inter Partes Review of U.S. Pat. No. 8,749,968; United States Patent and Trademark Office, Before the 5 Patent Trial and Appeal Board, *CoolIT Systems, Inc.* v. *Asetek A/S*, Inter Partes Review No. 2014-01172, Jul. 16, 2014; 61 pages.

Requirement Restriction for U.S. Appl. No. 13/401,618, dated Sep. 18, 2014.

Non-Final Office Action for U.S. Appl. No. 14/210,165, dated Sep. 29, 2014.

Non-Final Office Action for U.S. Appl. No. 14/283,163, dated Sep. 30, 2014.

Non-Final Office Action for U.S. Appl. No. 14/183,443, dated Oct. 30, 2014.

Restriction Requirement for U.S. Appl. No. 13/559,340, dated Oct. 31, 2014.

English Translation of Examination and Search Report for Taiwan Application No. 103109612, dated Jan. 1, 2015.

(56) References Cited

OTHER PUBLICATIONS

Third Party Preissuance Submission for U.S. Appl. No. 13/559,340, mailed Jan. 9, 2015.
Preissuance Submission for U.S. Appl. No. 13/401,618, mailed Jan. 9, 2015.
Ex Parte Quayle Action for U.S. Appl. No. 14/210,165, mailed Feb. 5, 2015.
Restriction Requirement for U.S. Appl. No. 14/550,952, dated Feb. 5, 2015.
Notice of Allowance for U.S. Appl. No. 14/210,165, dated Feb. 20, 2015.
Non-Final Office Action for U.S. Appl. No. 13/559,340, dated Mar. 26, 2015.
Notice of Allowance for U.S. Appl. No. 14/183,443, dated Apr. 30, 2015.
Final Office Action for U.S. Appl. No. 14/283,163, dated May 14, 2015.
English Translation of Examination and Search Report for Taiwan Application No. 101127180, dated May 21, 2015.
Petition for Inter Parties Review of U.S. Pat. No. 8,746,330 in *Asetek Danmark A/S v. CoolIT Systems Inc.* filed May 27, 2015.
Declaration of Dr. Donald Tilton (including his CV) from Petition for Inter Parties Review of U.S. Pat. No. 8,746,330 in *Asetek Danmark A/S v. CoolIT Systems Inc.* dated May 27, 2015.
Non-Final Office Action for U.S. Appl. No. 14/550,952, dated Jul. 7, 2015.
Non-Final Office Action for U.S. Appl. No. 13/401,618, dated Jul. 28, 2015.
Advisory Action for U.S. Appl. No. 14/283,163, dated Aug. 3, 2015.
Non-Final Office Action for U.S. Appl. No. 14/283,163, dated Sep. 4, 2015.
Final Office Action for U.S. Appl. No. 13/559,340, dated Sep. 8, 2015.
Office Action for Taiwan Application No. 103109612, dated Sep. 21, 2015.
Final Office Action for U.S. Appl. No. 14/550,952, dated Oct. 20, 2015.
Advisory Action for U.S. Appl. No. 13/559,340, dated Dec. 2, 2015.
Osinski, United States Patent and Trademark Office Decision of Institution of Inter Partes Review. Filed Dec. 9, 2015 in Case IPR2015-01276.
English translation of Notice of Allowance in Taiwan Application No. 103109612, dated Dec. 11, 2015.
Non-Final Office Action for U.S. Appl. No. 13/559,340, dated Jan. 15, 2016.
Final Office Action for U.S. Appl. No. 13/401,618, dated Jan. 26, 2016.
English translation of Notice of Allowance in Taiwan Application No. 101127180, dated Feb. 19, 2016.
Pollard, United States Patent and Trademark Office Patent Owner's Response. Filed Mar. 9, 2016 in Case PR2015-01276.
Final Office Action for U.S. Appl. No. 14/283,163, dated Jun. 15, 2016.
Notice of Allowance for U.S. Appl. No. 13/401,618, dated Jul. 27, 2016.
Restriction Requirement for U.S. Appl. No. 14/217,080, dated Sep. 21, 2016.
Notice of Allowance for U.S. Appl. No. 13/559,340, dated Sep. 23, 2016.
USPTO Patent Trial and Appeal Board Final Written Decision in Case IPR2015-01276 dated Dec. 8, 2016.
Notice of Allowance for U.S. Appl. No. 14/283,163, dated Jan. 19, 2017.
English translation of Examination Report in Taiwan Application No. 101110072, dated Feb. 8, 2017.
Non-Final Office Action for U.S. Appl. No. 15/263,210, dated Feb. 10, 2017.
Non-Final Office Action for U.S. Appl. No. 14/217,080, dated Mar. 9, 2017.
Non-Final Office Action for U.S. Appl. No. 15/462,753, dated May 11, 2017.
English translation of Notice of Allowance in Taiwan Application No. 101110072, dated Aug. 17, 2017.
Final Office Action for U.S. Appl. No. 15/462,753, dated Sep. 15, 2017.
Non-Final Office Action for U.S. Appl. No. 14/777,510, dated Oct. 11, 2017.
Notice of Allowance for U.S. Appl. No. 15/263,210, dated Oct. 30, 2017.
Notice of Allowance for U.S. Appl. No. 14/217,080, dated Nov. 1, 2017.
Non-Final Office Action in U.S. Appl. No. 15/351,362, dated Feb. 7, 2019, 20 pages.
Final Office Action in U.S. Appl. No. 14/777,510, dated Jul. 30, 2018, 23 pages.
Non-Final Office Action in U.S. Appl. No. 14/777,510, dated Apr. 23, 2018, 23 pages.
Non-Final Office Action in U.S. Appl. No. 15/354,982, dated May 8, 2018, 19 pages.
Final Office Action in U.S. Appl. No. 15/354,982, dated Oct. 9, 2018, 9 pages.
Non-Final Office Action in U.S. Appl. No. 15/351,362, dated Nov. 18, 2019, 12 pages.
Dave Altavilla, "Asetek Antarctica WaterChill Water Cooling Kit.," HotHardware.com, Jun. 8, 2004, (https://hothardware.com/reviews/asetek-antarctica-waterchill-water-cooling-kit) last accessed on Jun. 14, 2022, 7 pages.
Centrifugal Pump Overview, Appendix B., http://nptel.ac.in/courses/11210117/ui/Course_hone-8.htm, Jan. 5, 2018, pp. 1-10.
Rob Darby, "Internal Flow Applications," Chemical Engineering Fluid Mechanics, 2001, pp. 195-238, Chapter 7, Marcel Dekker, Inc., New York, NY.
John S. Scott, "Header" and "Manifold," Dictionary of Civil Engineering, 4th Edition, 1993, pp. 211 and 269, Van Nostrand Reinhold, New York, NY.
"Asetek Reviews" TechPowerUp Review Database (https://www.techpowerup.com/reviewdb/Cooling/Water/Asetek/) last accessed Jun. 14, 2022, 3 pages.
Ryszard Sommefeldt, "Review: Asetek WaterChill Antarctica KT03A-L30," HEXUS.net, Aug. 2, 2004, 3 pages (https://m.hexus.net/tech/reviews/cooling/791-asetek-waterchill-antarctica-kt03a-l30/?page=2) last accessed Jun. 14, 2022.
"Asetek Antarctica WaterChill CPU Cooling Kit Review," Overclocker Club, Apr. 25, 2004 (https://www.overclockersclub.com/reviews/asetek/5.htm) last accessed Jun. 14, 2022.
"Asetek Antarctica Waterblock" Overlookers, Feb. 28, 2004 (https://www.overclockers.com/asetek-antarctica-waterblock/) last accessed Jun. 14, 2022, 6 pages.
"Asetek WaterChill" Techspot, Mar. 14, 2006 (https://www.techspot.com/community/topics/asetek-waterchill.46119/), last accessed Jun. 14, 2022, 7 pages.
"WaterChill CPU Cooler Antarctica Pour Port Intel Socket 478, AMD Docket 462/754/939/940," Jun. 4, 2004 & Oct. 18, 2004, 10 pages, Version 4.0 & 4.1, Asetek, Inc.
CPU-360 Water Block (AMD/Intel Processor). Rev 1.1, Koolance, (https://koolance.com/cpu-360-processor-water-block) last accessed on Oct. 30, 2020, 1 page.
"Asetek WaterChill Antarctica Water Cooling Kit," Asetek, (https://www.extremeoverclocking.com/reviews/cooling/WaterChill_Antarctica_1.html) last accessed on Oct. 30, 2020, 11 pages.
Hilbert Hagedoom, "Aseteck Waterchill Watercooling—p. 1—a Chill Introduction," Guru3D.com, Feb. 28, 2005, 25 pages.
Hilbert Hagedoom, "Koolance CPU-360 Waterblock," Guru.com, Feb. 9, 2010, (https://www.guru3d.com/news-story/koolance-cpu-360-waterblock), last accessed on Jun. 14, 2022, 2 pages.
Matthew Homan, "WaterChill By Asetek," TechwareLabs, LLC, Dec. 11, 2004, (http://www.techwarelabs.com/reviews/cooling/asetek_waterchill/) last accessed on Jun. 14, 2022, 3 pages.
3DGameman, "#530—Asetek WaterChill2 Water Cooling Kit," YouTube, Jul. 16, 2006, (https://www.youtube.com/watch?v=60XNAXO9cxY) last accessed on Jun. 14, 2022.

(56) References Cited

OTHER PUBLICATIONS

3DGameman, "#596—Asetek Xtreme WaterChill Water Cooling Kit," YouTube, Jul. 17, 2006, (https://www.youtube.com/watch?v=Z9XSJBCJttU) last accessed on Jun. 14, 2022.
Adrian Willson, "(1080) Koolance CPU 360 CPU Waterblock Review," YouTube, Mar. 14, 2010, (https://www.youtube.com/watch?v=hhWP7rF1uQs) last accessed on Jun. 14, 2022.
Super1080P, "(1080) Koolance CPU 360 CPU Waterblock Review," YouTube, Mar. 17, 2010, (https://www.youtube.com/watch?v=3kg4Yvl1XLU) last accessed on Oct. 30, 2020.
"WaterChill CPU Cooler Antarctica For Intel Socket 478, AMD Socket A/754/940," Apr. 13, 2004, 14 pages, Version 4.0, Asetek, Inc.
"WaterChill CPU Cooler Antarctica For Intel Socket 478, AMD Socket 462/754/940," Jun. 4, 2004, 9 pages, Version 4.1, Asetek, Inc.
"WaterChill CPU Cooler Antarctica For Intel Socket 478, AMD Socket A/754/940," Mar. 30, 2004, 2 pages, Version 4.0, Asetek, Inc.
"WaterChill CPU Cooler Antarctica Pour Port Intel Socket 478, AMD Socket 462/754/940," Jun. 4, 2004 & Oct. 18, 2004, 10 pages, Version 4.0 & 4.1, Asetek, Inc.
"WaterChill CPU-Kühler Antarctica Für Intel Socket 478, AMD Socket 462/754/940," Jun. 4, 2004, 10 pages, Version 4.0, Asetek, Inc.
Refrigerador de CPUs WaterChill Antarctica Para Intel Socket 478, AMD Socket 462/754/940, Jun. 4, 2004, 9, pages, Version 4.0, Asetek.
"WaterChill CPU-Kühler Antarctica Für Intel Socket 478, AMD Socket 462/754/939/940," Jun. 4, 2004, & Oct. 18, 2004, 9 pages, Version 4.0 & 4.1, Asetek, Inc.
"WaterChill CPU Cooler Antarctica For Intel Socket 478, AMD Socket 462/754/939/940," Jun. 4, 2004 & Oct. 18, 2004, 9 pages, Version 4.0 & 4.1, Asetek, Inc.
"Refrigerador de CPUs WaterChill Antarctica Para Intel Socket 478, AMD Socket 462/754/939/940," Jun. 4, 2004 and Oct. 18, 2004, 9, pages, Version 4.0 & 4.1, Asetek, Inc.
"Electronic-Actuated Valves," Direct Industry,(https://www.directindustry.com/industrial-manufacturer/electrically-actuated-valve-118189.html), last accessed Jun. 16, 2022).

* cited by examiner

COOLING MODULE WITH LEAK DETECTOR AND RELATED SYSTEMS

PRIORITY INFORMATION

This application claims benefit of and priority to U.S. patent application Ser. No. 17/952,101, filed Sep. 23, 2022, which claims benefit of and priority to U.S. patent application Ser. No. 16/851,021, filed Apr. 16, 2020, now U.S. Pat. No. 11,473,860, issued Oct. 18, 2022, which claims benefit of and priority to U.S. Patent Application No. 62/838,457, filed Apr. 25, 2019. Each of the foregoing applications is hereby incorporated by reference in its entirety as if fully set forth herein, for all purposes.

FIELD

This application and the subject matter disclosed herein (collectively referred to as the "disclosure"), generally concern liquid-cooled heat exchangers, and related systems and methods. More particularly, but not exclusively, this disclosure pertains to systems, methods, and components to detect and/or to mitigate effects of seepage or leakage of liquid from a liquid-cooled heat exchanger used to cool an electronic device.

BACKGROUND INFORMATION

The schematic illustration in FIG. 1 shows several functional features common among disclosed fluid-based heat exchanger systems. For example, the fluid circuit 10 has a first heat exchanger 11 (e.g., a liquid-cooled heat exchanger) configured to absorb heat from a heat source (not shown in FIG. 1) and a second heat exchanger 12 configured to reject heat from the circuit 10. As indicated in FIG. 1, a working fluid, or coolant (e.g., a liquid coolant), can circulate between the heat exchangers 11, 12 to carry the energy absorbed by the working fluid in the first heat exchanger 11 to the second heat exchanger 12 where energy can be rejected to another medium from the fluid. One or both of the heat exchangers 11, 12 can be a microchannel heat exchanger.

As used herein, the term "microchannel" means a fluid conduit, or channel, having at least one major dimension (e.g., a channel width) measuring less than about 1 mm, such as, for example, about 0.1 mm, or several tenths of millimeters.

As used herein, "fluidic" means of or pertaining to a fluid (e.g., a gas, a liquid, a mixture of a liquid phase and a gas phase, etc.). Thus, two regions that are "fluidicly coupled" are so coupled to each other as to permit a fluid to flow from one of the regions to the other region in response to a pressure gradient between the regions.

As used herein, the terms "working fluid" and "coolant" are interchangeable. Although many formulations of working fluids are possible, common formulations include distilled water, ethylene glycol, propylene glycol, and mixtures thereof.

Referring again to FIG. 1, the working fluid typically enters a first manifold 13 (sometimes after passing through an inlet plenum, which is omitted from FIG. 1 for ease of illustration). From the manifold 13, the fluid can be distributed among a plurality of fluid passages 14 configured to transfer heat from a heat-transfer surface, e.g., a wall in the heat exchanger 11, to the working fluid. In some embodiments, such as the examples described below, the fluid passages 14 are configured as microchannels and the walls are configured as extended heat-transfer surfaces, or fins.

During operation of the circuit 10, energy conducts (e.g., diffuses) from the walls of the first heat exchanger into adjacent fluid particles within the passages 14, and the adjacent fluid particles are swept away from the wall, or advected, carrying the energy absorbed from the walls. The swept-away particles are replaced by other, usually cooler fluid particles, which more readily absorb energy from the walls (e.g., by virtue of their usually lower temperature). Such a combination of conduction and advection (i.e., convection) provides an efficient approach for cooling devices having a relatively high heat flux, such as, for example, electronic devices.

After passing through the plurality of passages 14 in the first heat exchanger 11, the heated working fluid collects in an exhaust manifold 15 and passes to the second heat exchanger 12, carrying with it the energy absorbed from the first heat exchanger 11. As the heated fluid passes through the second heat exchanger 12, energy is rejected from the fluid to another medium (e.g., to another working fluid, such as, for example, the air or a building's liquid water supply) through convection processes similar to those described above. From the second heat exchanger, the cooled working fluid passes through a pump 16 and back to the first heat exchanger 11. In general, the working fluid can be a liquid, a gas, or a saturated mixture thereof.

The dashed box in FIG. 1 indicates that several functional components of the circuit 10 can be integrated into a single subassembly. As an example, the subassembly 20 includes the pump 16, the manifolds 13, 15 and the passages 14, as well as, for example, conduits between the pump and the manifold 13. An inlet 21 and an outlet 22 operatively couple the subassembly 20 to the second heat exchanger 12.

SUMMARY

In some respects, concepts disclosed herein generally concern systems, methods and components to detect a presence of a liquid externally of a desired primary flow path through a segment of a fluid circuit, e.g., throughout a cooling loop. Some disclosed concepts pertain to systems, methods, and components to direct seepage or leakage of a liquid coolant toward a lead-detection sensor. As but one example, some disclosed liquid-cooled heat exchangers incorporate a leak-detection sensor, which, in turn, can couple with a computing environment that monitors for detected leaks, and, responsive to an indication of a detected leak, invokes a task to control or to mitigate the detected leak.

According to one aspect, a liquid-cooled heat exchanger is configured to cool a heat-dissipation component by transferring heat dissipated by the heat-dissipation component to a liquid coolant in the heat exchanger.

The heat exchanger includes a heat sink having a first major surface defining a region configured to be placed into thermal contact with a corresponding surface of a heat-dissipation component. Such thermal contact conductively transfers heat from the heat-dissipation component to the heat sink. The heat sink has a second major surface positioned opposite the first major surface.

A housing assembly is coupled with the heat sink, defining an internal passageway configured to direct a flow of liquid coolant over the second major surface of the heat sink. Such flow of liquid coolant convectively transfers heat from the heat sink to the liquid coolant.

A peripheral channel extends at least partially around the region of the first major surface configured to be placed into thermal contact with the heat-dissipation component. A liquid-detection sensor is positioned in the peripheral channel.

In an embodiment, the liquid-detection sensor extends at least partially around the region of the first major surface of the heat sink.

The heat sink can define the channel. The housing can define the channel. The heat sink can define a portion of the channel and the housing can define a portion of the channel.

Each of the housing and the second major surface of the heat sink can have a corresponding peripheral region. The peripheral region of the housing and the peripheral region of the second major surface can face each other in an opposed relationship, defining an interface between the housing and the heat sink. The interface can define an interstitial gap extending toward the liquid-detection sensor positioned in the peripheral channel.

The housing can include two members coupled together, defining an interface between the two members. One or both of the members can so define a corresponding recess from the interface as to define an interface channel extending along the interface.

A disclosed liquid-cooled heat exchanger can further include an inlet to the liquid-cooled heat exchanger and an outlet from liquid-cooled heat exchanger. The flow path can extend through the liquid-cooled heat exchanger and from the inlet to the outlet. In an embodiment, the inlet can include a coupler configured to sealably couple with a liquid conduit. Moreover, the coupler can define a lumen fluidly coupled with the flow path. In an embodiment, the coupler extends into the housing. An interstitial region between the coupler and the housing can fluidly couple, directly or indirectly, with the peripheral channel.

In an embodiment, the outlet includes a coupler configured to sealably couple with a conduit for liquid, and the coupler can define a lumen fluidly coupled with the flow path. The coupler can extend into the housing and an interstitial region between the coupler and the housing can fluidly couples directly or indirectly, with the peripheral channel.

In an embodiment, the flow path is a primary flow path for the liquid coolant. The liquid-cooled heat exchanger can define one or more interstitial flow paths between adjacent regions. At least one of the interstitial flow paths can fluidly couple with the channel.

The housing can include an assembly of at least two members. The assembly of two members defines an interstitial region positioned between the members and the interstitial region fluidly couples with the peripheral channel.

In an embodiment, the channel defines a peripherally extending, open face. The heat-exchange module can include a cover so overlying the open face as to enclose the peripheral channel. For example, the cover can be substantially planar and define opposed first and second major surfaces. The first major surface of the cover can be positioned in an opposed relationship with the first major surface of the heat sink and extend across the peripheral channel. In an embodiment, the cover defines an aperture extending around the region of first major surface configured to be placed into thermal contact with the heat-dissipation component.

The liquid-cooled heat exchanger can define an outer peripheral wall extending in a transverse direction relative to a plane defined by the first major surface of the heat sink. The outer peripheral wall can define a corresponding outer surface. The liquid-cooled heat exchanger can further define a secondary channel extending from the outer surface of the outer peripheral wall to the peripherally extending channel. In an embodiment, an electrical conductor associated with the liquid-detection sensor extends through the secondary channel. In some heat exchangers, a grommet is positioned within the secondary channel, and the electrical conductor extends from secondary channel, through the grommet, and externally of the liquid-cooled heat exchanger. An electrical connector can be coupled with the electrical conductor, and the electrical connector can be configured to matingly engage with a correspondingly configured electrical connector coupled with a computing environment.

In an embodiment, the heat exchanger includes an electrical circuit configured to output an electrical signal responsive to a detected presence of liquid by the liquid-detection sensor.

According to another aspect, a cooling system for a computer system is disclosed. The cooling system includes a liquid-cooled heat exchanger configured to cool a heat-dissipation component by transferring heat dissipated by the heat-dissipation component to a liquid coolant in a primary flow path of the heat exchanger. A liquid-detection sensor is coupled with the liquid-cooled heat exchanger and so positioned relative to the primary flow path as to be exposed to a leak of the liquid coolant from the primary flow path.

In an embodiment, the liquid-cooled heat exchanger includes at least two members defining an interface region therebetween. The primary flow path can extend adjacent the interface region. The liquid-detection sensor can extend adjacent the interface region.

In an embodiment, the interface region defines a recessed channel extending from a first end positioned adjacent the primary flow path toward the leak-detection sensor.

At least one of the members can be a heat sink cooled by the liquid coolant.

A disclosed cooling system can include an electrical circuit configured to output an electrical signal responsive to a detected presence of liquid by the liquid-detection sensor.

In an embodiment, the liquid-cooled heat exchanger is a first heat exchanger. The cooling system can also include a second heat exchanger configured to reject heat from the liquid coolant to another medium.

In an embodiment, the cooling system also includes a controller configured to actuate a flow-restriction device responsive to an output from the leak-detection sensor.

In an embodiment, the cooling system also includes an actuatable valve or other actuatable device configured to interrupt a flow of the liquid coolant through the cooling system, e.g., responsive to an output from the leak-detection sensor.

Also disclosed are associated methods, as well as tangible, non-transitory computer-readable media including computer executable instructions that, when executed, cause a computing environment to implement one or more methods disclosed herein. Digital signal processors embodied in software, firmware, or hardware and being suitable for implementing such instructions also are disclosed.

The foregoing and other features and advantages will become more apparent from the following detailed description, which proceeds with reference to the accompanying drawings.

BRIEF DESCRIPTION OF THE DRAWINGS

Referring to the drawings, wherein like numerals refer to like parts throughout the several views and this specification, aspects of presently disclosed principles are illustrated by way of example, and not by way of limitation.

DETAILED DESCRIPTION

The following describes various principles related to cooling modules with leak detection, and related systems. For example, certain aspects of disclosed principles pertain to approaches for packaging of leak-detection sensors, and other aspects pertain to features of cooling modules contemplated to control a secondary flow of a leaked coolant. That said, descriptions herein of specific apparatus configurations and combinations of method acts are but particular examples of contemplated systems chosen as being convenient illustrative examples of disclosed principles. One or more of the disclosed principles can be incorporated in various other systems to achieve any of a variety of corresponding system characteristics.

Thus, systems having attributes that are different from those specific examples discussed herein can embody one or more presently disclosed principles, and can be used in applications not described herein in detail. Accordingly, such alternative embodiments also fall within the scope of this disclosure.

I. OVERVIEW

As noted above, a liquid-cooled heat exchanger (sometimes referred to in the art as a "cold plate") can be configured to cool a heat-dissipation component (e.g., an electronic device), as by facilitating a transfer of heat dissipated by the component to a liquid coolant passing through the heat exchanger. For example, referring to FIGS. 2 and 3, a liquid-cooled heat exchanger 200 can include a heat sink 210. The heat sink 210 can have a first major surface 211 defining a region 212 configured to be placed into thermal contact with a corresponding surface of a heat-dissipation component (not shown). Such thermal contact can conductively transfer heat from the heat-dissipation component to the heat sink. 210.

Figure 4:
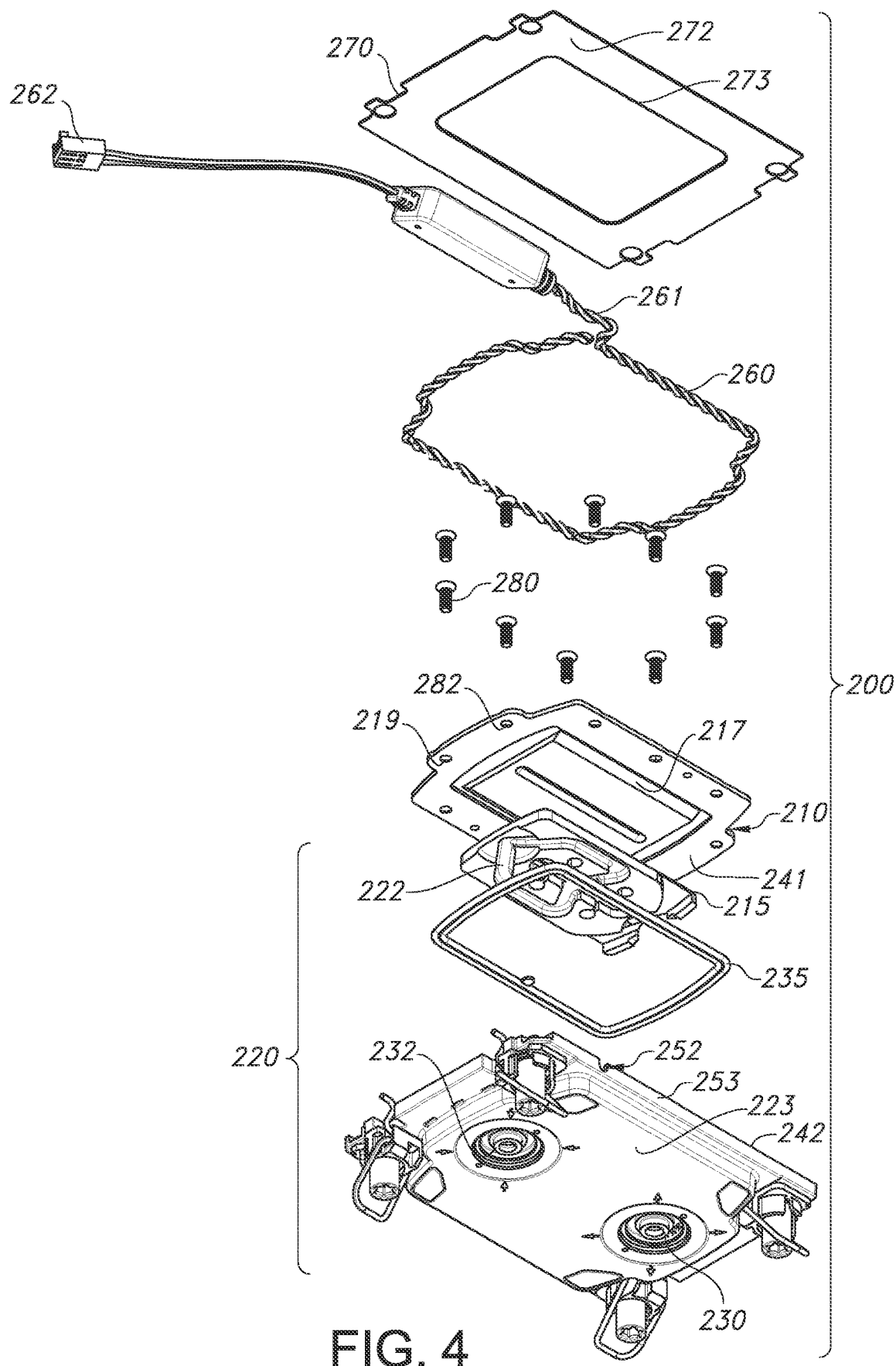
FIG. 4 shows an exploded view of the heat exchanger shown in FIG. 2.
Figure 5:
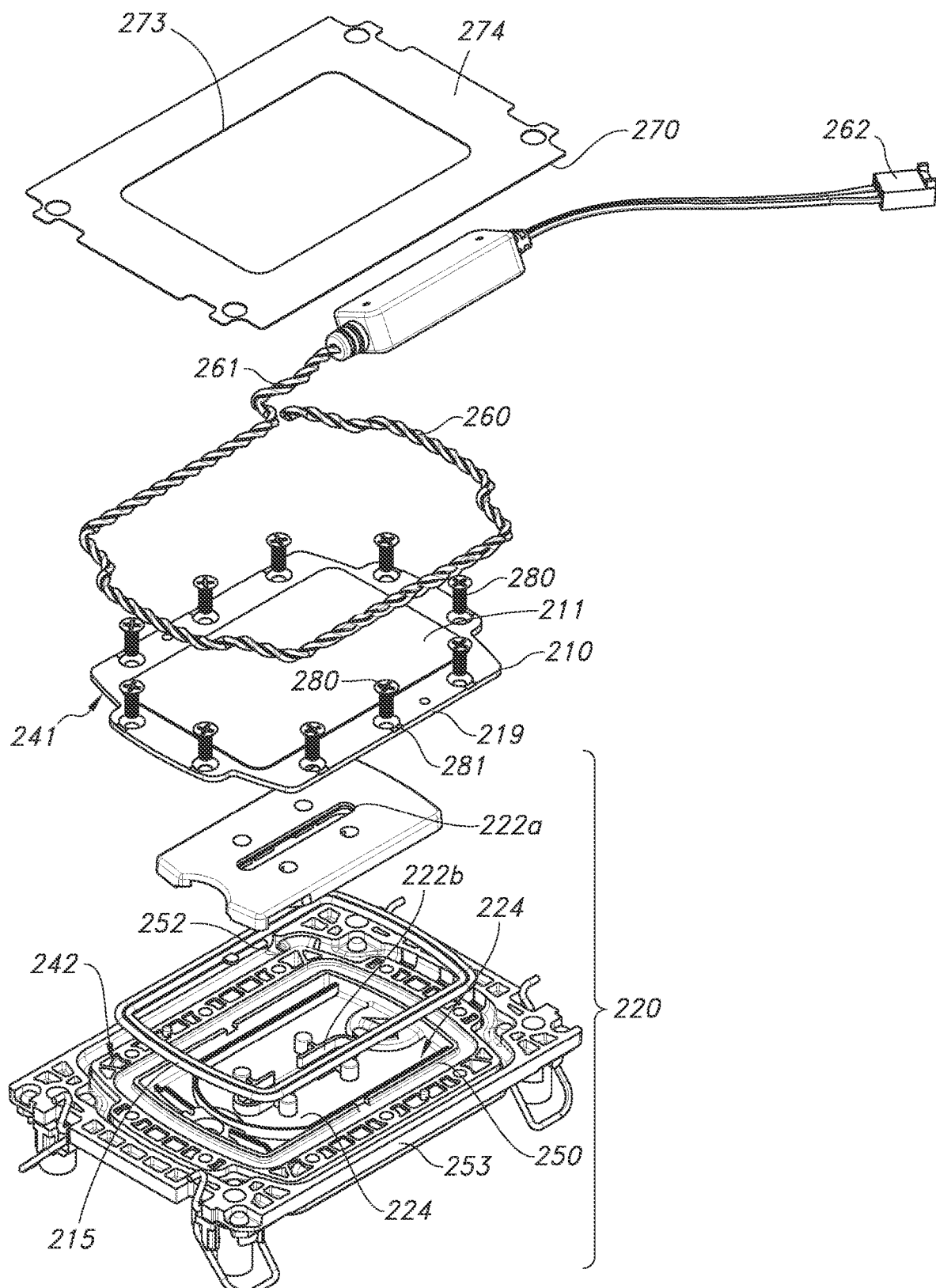
FIG. 5 shows another exploded view of the heat exchanger shown in FIG. 2.

Referring now to FIGS. 4 and 5, the heat sink 210 can have a second major surface 213 positioned opposite the first major surface 211 that contacts the heat-dissipation component. The liquid-cooled heat exchanger 200 can direct a flow of liquid coolant across a heat-transfer surface 214 (e.g., through microchannels defined by a plurality of fins defined by the second major surface 213). The flow of liquid coolant can convectively transfer heat from the heat-transfer surface 214 to the liquid coolant. As but one example, a housing assembly 220 can be coupled with the heat sink 210, defining an internal passageway 217 configured to direct the flow of liquid coolant over the second major surface of the heat sink 210. Myriad arrangements of liquid-cooled heat exchangers are possible.

Figure 1:
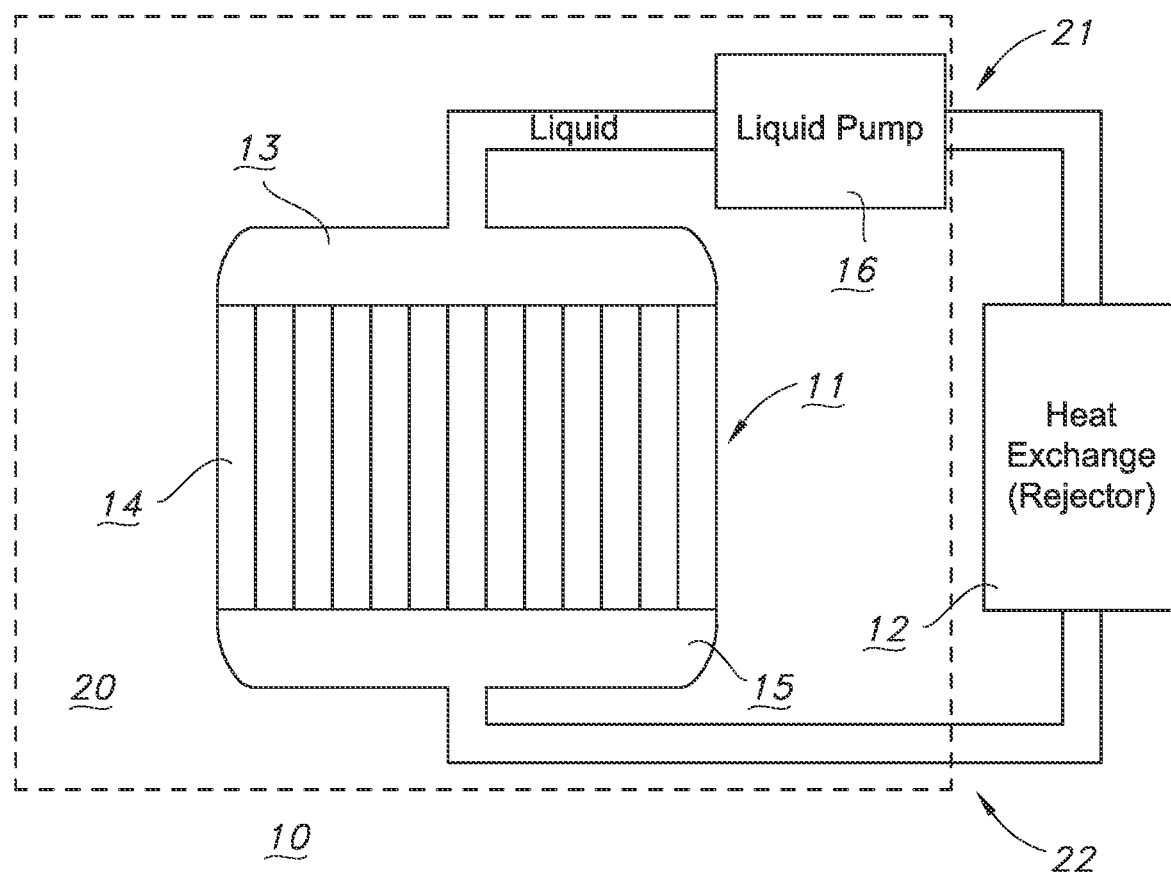
FIG. 1 shows a fluid circuit configured to transfer heat from one region to another with a circulatable working fluid.

For example, passive liquid-cooled heat exchangers, as in FIGS. 2 through 5, typically have an inlet 230 to receive relatively cooler liquid coolant from another (e.g., separate) component (e.g., a pump) in a cooling loop (as in FIG. 1) and an outlet 232 to exhaust relatively warmer liquid coolant to another (e.g., separate) component (e.g., a liquid-to-air heat exchanger, a liquid-to-liquid heat exchanger) in the cooling loop. Such a passive heat exchanger can define a flow path extending from the inlet 230, across a heat-transfer surface 214, and to the outlet 232. Examples of passive liquid-cooled heat exchangers are described in U.S. Pat. No. 8,746,330, the disclosure of which is hereby incorporated by reference in its entirety as fully as if reproduced herein, for all purposes.

By contrast, active liquid-cooled heat exchangers (e.g., shown in FIG. 6) can incorporate a pump 310 in an integrated pump-and-heat-exchanger assembly 300. The pump can be a primary pump (e.g., as pump 16 in FIG. 1) to circulate coolant through a cooling loop 10 or a secondary pump to augment a pressure head provided by another (e.g., primary) pump. Regardless, an active liquid-cooled heat exchanger 300, similarly to a passive heat exchanger, typically has an inlet 312 to receive coolant and an outlet 314 to exhaust coolant. A primary flow path through an active liquid-cooled heat exchanger also typically extends from the inlet 312 to the outlet 314. However, the primary flow path through an active heat exchanger 300 can pass through the pump 310 as well as over a heat-transfer surface 321, as defined by a heat sink 320. In some embodiments, the primary flow path extends through the pump 310 before passing over the heat-transfer surface 321, and in other embodiments, the primary flow path extends over the heat-transfer 321 surface before passing through the pump 310. Examples of active liquid-cooled heat exchangers are described in U.S. Pat. No. 9,057,567, the disclosure of which is hereby incorporated by reference in its entirety as fully as if reproduced herein, for all purposes.

As indicated above and shown by way of example in FIGS. 2 through 6, active- and passive-embodiments of liquid-cooled heat exchangers typically include an assembly of constituent members. As well, at least a segment of a primary flow path through either type of liquid-cooled heat exchanger often is bounded wholly or partially by adjacent members. For example, a segment of a flow path can extend between adjacent members or from a passage in one member to a passage in an adjacent member. In both instances, complementary regions of the adjacent members may be placed in an abutting, a mating, or another relationship with or relative to each other in a manner that defines an interface region between the members.

The interface region, in turn, defines one or more interstices between the adjacent members. Such an interstice can arise through various mechanisms. For example, microscopic or macroscopic surface imperfections, collectively referred to as "surface roughness," on one or both members at the interface region can give rise to interstices within the interface. Such surface roughness may arise through manufacturing processes, or by virtue of molecular, crystalline, or grain structures within one or both members at or near the interface region.

Gaskets, seals, sealants, machining processes, polishing processes, etc., can be applied to an interface between adjacent members of a liquid-cooled heat exchanger. For example, each of two mating surfaces of adjacent members can be machined or polished to reduce surface roughness of each respective surface. And, a pliant gasket can be positioned between the mating surfaces. Such a gasket can, for example, deform and at least partially fill an interstitial region between the mating surfaces, sealing the interface region. Nonetheless, and irrespective of the origin of such interstices or steps taken to reduce and/or to fill them, an interface between adjacent members in a liquid-cooled heat exchanger can, under certain conditions, permit liquid coolant to seep, leak, or flow into, or otherwise enter, an interstitial region at the interface between adjacent members.

According to an aspect of disclosed embodiments, an interface between adjacent members of a liquid-cooled heat exchanger (active or passive) can be arranged to selectively direct liquid coolant that enters an interstitial region. For example, the interface can be arranged as a secondary flow path to direct liquid coolant to a selected region of the heat exchanger, e.g., to a storage reservoir or a channel. As well, or alternatively, the secondary flow path can direct liquid coolant toward a leak-detection sensor. Such a leak-detection sensor can emit a signal or otherwise respond to being exposed to a liquid. And, a computing environment can invoke a task responsive to a signal or other indication of a presence of liquid by a leak-detection sensor.

Examples of leak-detection sensors and associated leak-detection circuits, controllers, and computing environments, as well as associated methods, are described in U.S. patent application Ser. No. 14/210,165, filed Mar. 13, 2014, now U.S. Pat. No. 9,052,252, and U.S. patent application Ser. No. 14/777,510, filed Mar. 14, 2014, the disclosures of which are hereby incorporated by reference in their entirety as fully as if reproduced herein, for all purposes.

A liquid-cooled heat exchanger (active or passive) can incorporate a leak-detection sensor. The leak-detection sensor can be strategically positioned relative to a secondary flow path of liquid coolant through, in, or on a heat exchanger. For example, such a secondary flow path can convey liquid coolant that leaks from a primary flow path through the liquid-cooled heat exchanger. For example, such a leak can originate at an interface between two members of the liquid-cooled heat exchanger that define a segment of the primary flow path. The interface can define a segment of the secondary flow path and can be configured to convey leaked liquid coolant to or toward a selected region of the heat exchanger, e.g., a channel in which the leak-detection sensor is placed.

The principles disclosed herein overcome many problems in the prior art and address one or more of the aforementioned or other needs. Further details of disclosed principles are set forth below. Section II describes principles pertaining to liquid-cooled heat exchangers that incorporate a leak-detection sensor. Section III describes principles pertaining to leak-detection sensors. Section IV discloses principles related to control logic, and Section V discloses principles pertaining to computing environments, e.g., suitable for implementing disclosed control logic technologies.

Other, related principles also are disclosed. For example, the following describes machine-readable media containing instructions that, when executed, cause a processor of, e.g., a computing environment, to perform one or more disclosed methods. Such instructions can be embedded in software, firmware, or hardware. In addition, disclosed methods and techniques can be carried out in a variety of forms of processor or controller, as in software, firmware, or hardware.

II. LIQUID-COOLED HEAT-EXCHANGERS

Referring now to FIGS. 2 through 5, an embodiment of a passive liquid-cooled heat exchanger 200 is briefly described. As with the active heat exchanger 300 shown in FIG. 6, the passive heat exchanger 200 has a heat sink 210 and a housing 210. The housing 220 can define one or more internal passageways 222a, 222b, for example. The housing 220 can define one or more regions 224 recessed from an internal major side 221 that, in conjunction with another member (e.g., a heat sink 210 and/or an insert 215), can partially define an internal passageway through the passive heat exchanger 200. An external major side 223 of the housing 220 can define one or more passages, e.g., inlet 230 and outlet 232. The inlet 230, the outlet 232, or both, can be configured to connect with a corresponding fluid coupler 231, 233, e.g., a barbed fitting. The passages 230, 232 through the housing and the internal passageways, whether defined exclusively within the housing 220 or between the housing 220 and another member (e.g., the insert 215 or the heat sink 210), can define respective segments of a primary flow path through the passive, liquid-cooled heat exchanger 200. A seal (e.g., an O-ring) 235 can be positioned between the housing 220 and the heat sink 210 to reduce and/or eliminate leakage or seepage of the working fluid from the primary flow path through the heat exchanger 200 along the interface 240 between the heat sink 210 and the housing 220. In an embodiment, the seal can be integrated with the insert, or can be a separate member from the insert as illustrated. To be clear, the illustrated passive heat exchanger 200 is but one example of a passive heat exchanger, and those of ordinary skill in the art following a review of this disclosure will appreciate the wide variety of configurations of heat exchangers that can embody disclosed principles.

Figure 6:
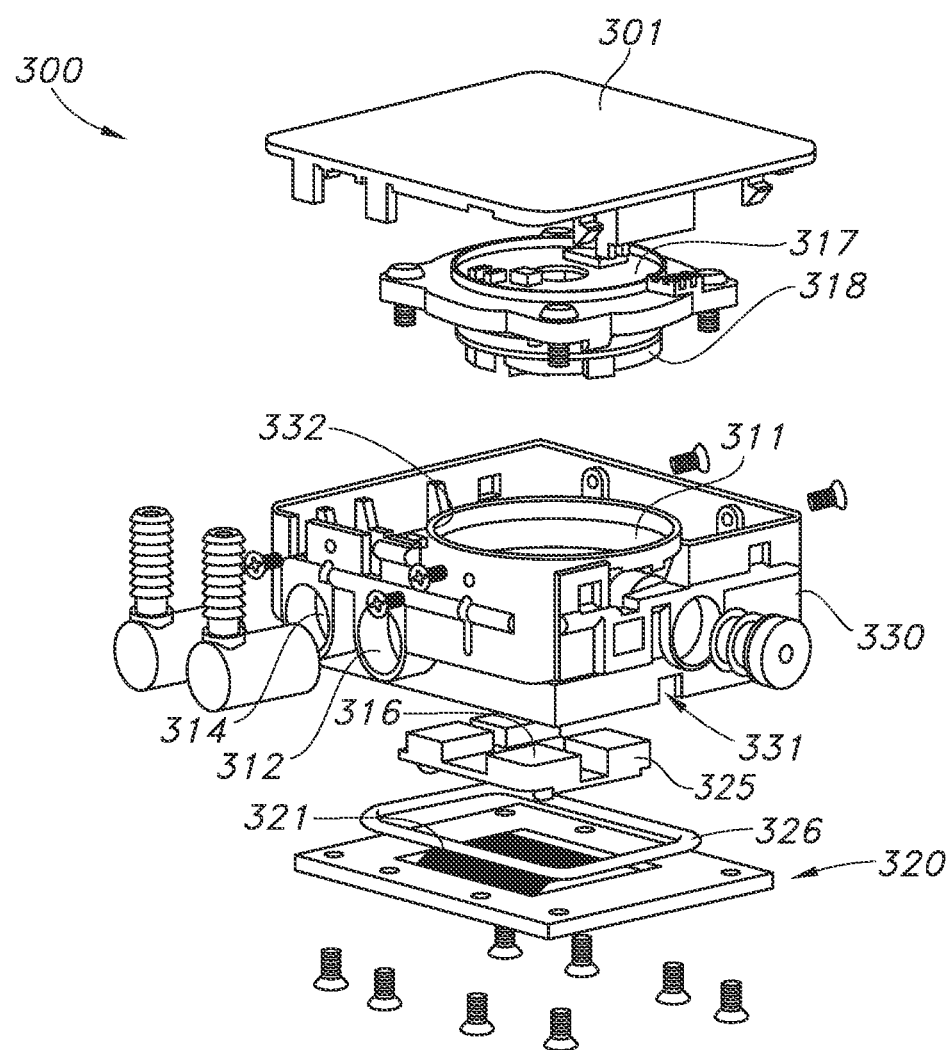
FIG. 6 illustrates an exploded view of an embodiment of an integrated pump and heat exchanger assembly, e.g., an active, liquid-cooled heat exchanger.

Referring now to FIG. 6, a working example of an active liquid-cooled heat exchanger 300 is briefly described. The active heat exchanger 300 has a pump 310 and a heat sink 320, as well as a housing 330. The housing 330 defines several internal passageways (e.g., from inlet 312 to pump volute 311), as well as regions 331, 332 recessed from each opposed, major side. The internal passageways define a primary flow path for a liquid coolant through the housing 330. Similarly, the walls of each respective recessed region 331, 332, in conjunction with another member overlying the respective recessed region, can define boundaries of a primary flow path for a liquid coolant through the heat exchanger 300. To be clear, the illustrated active heat exchanger 300 is but one example of an approach for integrating several elements of a fluid circuit 10 as in FIG. 1 (e.g., the pump 16 and the first heat exchanger 11, including the corresponding inlet manifold 13, the fluid passages 14, the exhaust manifold 15) into a single element while retaining the several elements' respective functions. The assembled heat exchanger 300 defines a primary flow path configured to convey a working fluid from the inlet port 312 to a pump volute 311, from the pump volute to an inlet 316 to the channels of the heat sink 320, and from an outlet from the heat sink channels to an outlet port 314.

The pump impeller 318 can be received in the pump volute 311. The impeller can be driven in rotation by an electric motor 317 in a known manner. A cap 301 can overlie the motor 317 and fasten to the housing 330 to provide the heat exchanger 300 with a finished appearance suitable for use with, for example, consumer electronics.

The side 331 of the housing 330 positioned opposite the pump volute 311 can, as with a passive heat exchanger 200, receive an insert 325 and the heat sink 320. A seal (e.g., an O-ring) 326 can be positioned between the housing 330 and the heat sink 320 to reduce and/or eliminate leakage or seepage of the working fluid from the primary flow path through the heat exchanger 300 along the interface between the heat sink and the housing.

Although not illustrated in FIG. 6, active heat exchangers and passive heat exchangers described herein can incorporate a leak-detection sensor and one or more physical features to accommodate the sensor. Moreover, disclosed active and passive heat exchangers can define one or more interstitial flow paths between adjacent regions or members, as to direct seepage or leakage of a liquid coolant toward the leak-detection sensor. For example, a given heat exchanger may include an assembly of at least two members, and the assembly can define an interstitial region positioned between the members. The interstitial region can fluidly couple with a channel or other feature of the heat exchanger housing, supporting, or containing the leak-detection sensor.

As an expedient and in the interest of succinctness, the following description of principles relating to leak-detection sensors (and physical features of liquid-cooled heat exchangers configured to accommodate such sensors) refers to embodiments and illustrations of passive heat exchangers. Nonetheless, it shall be understood that active heat exchangers as described above and/or shown in FIG. 6 can incorporate leak-detection sensors and any associated physical features described herein in relation to passive liquid-cooled heat exchangers for accommodating the sensor.

Figure 7:
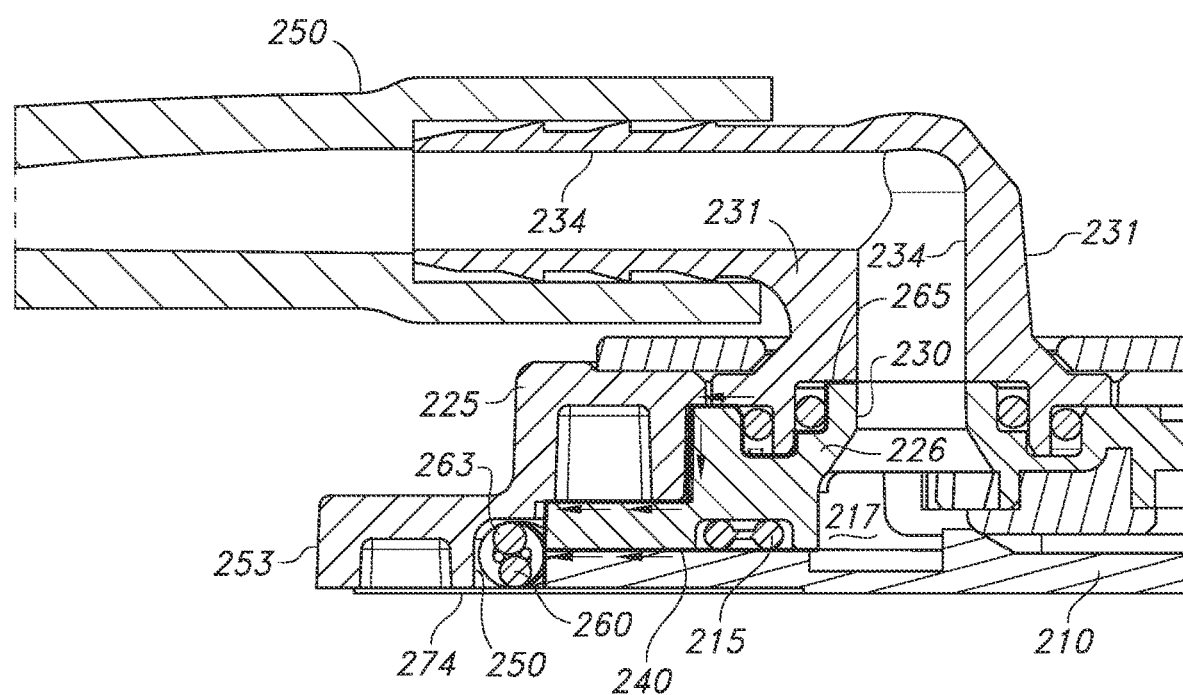
FIG. 7 illustrates a partial cross-sectional view of the heat exchanger shown in FIG. 2.
Figure 8:
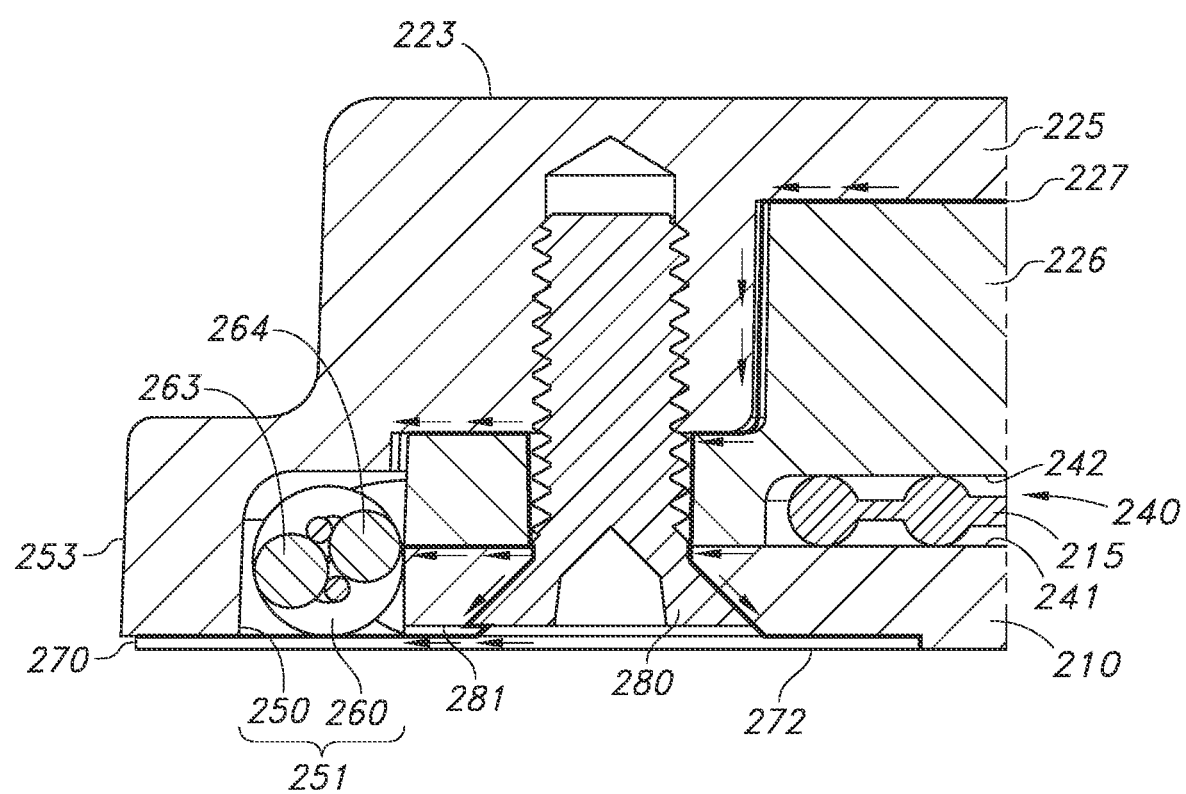
FIG. 8 illustrates a partial cross-sectional view of the heat exchanger shown in FIG. 2.

Referring now to FIGS. 5, 7 and 8, a peripheral channel 250 can extend at least partially around a selected region of the heat sink 210, and a liquid-detection sensor 260 can be positioned in the peripheral channel. Notwithstanding the seal 215, a liquid coolant can, under some conditions, seep into the interface 240 between the heat sink 210 and the housing 220. To facilitate detection of such an intrusion of liquid into the interface 240, the interface can define a secondary flow path (indicated by arrows in FIGS. 7 and 8) extending toward the liquid-detection sensor 260 positioned in the peripheral channel 250.

For example, the interface 240 between the heat sink 210 and the housing 220 can define an interstitial gap naturally arising by virtue of interstices at the interface. Alternatively, the interface can define one or more channels 216 originating adjacent the primary flow path 217 and extending toward the peripheral channel 250.

More particularly, but not exclusively, one or both of two opposed, mating surfaces can define a recessed region, e.g., a recessed channel 216 originating close to a primary flow path and extending toward the peripheral channel. FIG. 4 illustrates an example of such a channel. In FIG. 4, a peripheral region 241 of the first major surface 213 of the heat sink 210 is placed in opposed relationship with a corresponding peripheral region 242 of the housing 220. The peripheral region 241 defines a channel 216 recessed from the major surface 213.

The recessed channel 216 shown in FIG. 4 has a plurality of branches, in this instance three branches, originating near the primary flow path 217 and converging into a single branch 216a directed toward the peripheral channel 250. Although three branches are shown converging into one branch 216a, the recessed channel 216 can define any selected number and configuration of branches that converge into one or more channels. For example, the single channel 216a can merge with yet another channel (not shown), in a manner similar to a vascular system of a leaf on a deciduous tree. Alternatively, the recessed channel 216 can define a single-path channel that originates at a first end positioned near the primary flow path 217 and extends toward and/or opens to (e.g., merges with) the peripheral channel 250.

Regardless of the configuration of the recessed channel 216, the peripheral region 241 of the major surface 213 can define a plurality of recessed channels 216 distributed evenly or unevenly around the primary flow path 217, despite that only one example of a recessed channel 216 is depicted. With one or more recessed channels 216, capillary forces and/or a pressure differential between the primary flow path 217 and an ambient environment external of the heat exchanger 200 can urge a liquid coolant to seep into or through the recessed channel 216 toward and into the peripheral channel 250, wetting the leak-detection sensor 260.

To enhance capillary action, also sometimes referred to in the art as "wicking," a porous material or a porous structure (not shown) can be placed in the branched channel 216 and/or within the peripheral channel 250. For example, a partially sintered material that leaves an open, porous path through the channel one or more of the channels 216, 250 can enhance capillary action to draw seepage of liquid coolant through the respective channel. Alternatively, a fabric or a synthetic wick material can be embedded in the respective channel to provide enhanced wicking of liquid coolant.

Although an interstitial gap and a secondary flow path are described above in relation to an interface 240 between a housing member 220 and a heat sink member 210, a liquid-cooled heat exchanger 200 as in FIGS. 2 through 5 can define an interface between other members. As well, liquid coolant from the primary flow path through the heat exchanger can seep or otherwise leak into such an interface.

Referring now, by way of example, to FIGS. 7 and 8, a housing 220 can include a plurality of members coupled together. For example, two members 225, 226 are coupled together, defining an interface 227 between the two members. As with an interface 240 between a housing member 220 and a heat sink member 210 described above, one or both of the housing members 225, 226 can, but need not, define a corresponding recess from the interface 227 as to define an interface channel extending along the interface, e.g., toward the peripheral channel 250 in which the lead-detection sensor 260 is positioned.

As another example, as shown in FIG. 4, a liquid-cooled heat exchanger 220 can have an inlet 230 to the liquid-cooled heat exchanger and an outlet 232 from liquid-cooled heat exchanger, e.g., along a primary flow path. The primary flow path can extend through the liquid-cooled heat exchanger 200 and from the inlet 230 to the outlet 232. In FIG. 7, the inlet 230 includes a coupler 231, e.g., a barbed nipple, configured to sealably couple with a liquid conduit 250. The coupler 231 can define a lumen 234 fluidly coupled with the primary flow path 217. As shown, the coupler 231 can extend into the housing 220 and an interstitial region 265 between the coupler 231 and the housing 220 fluidly couples, directly or indirectly, with the peripheral channel 250 (e.g., depicted by heavily weighted line between different cross-hatched regions 226 and regions 231, 225 in FIG. 7).

Similarly to the inlet 230, the outlet 232 can include a coupler 233 configured to sealably couple with a conduit 252 for liquid, and the coupler can define a lumen (not shown) fluidly coupled with the primary flow path 217. As with the inlet coupler 231, the outlet coupler 233 can extend into the housing 220, and an interstitial region between the coupler 233 and the housing 220 can fluidly couple, directly or indirectly, with the peripheral channel 250.

Although the couplers 231, 233 are depicted as barbed elbow connections, the couplers can be configured as any suitable fluid connector for connecting a conduit to a heat exchanger.

The peripheral channel 250 can include a wicking material (not shown). Such a wicking material can absorb leaked coolant while still wetting the leak-detection sensor 260 positioned in the peripheral channel. Alternatively or additionally, the heat sink or another component of the heat exchanger 200 can define a recess or other open volume in fluid communication with the peripheral channel 250. Such a recess or other open volume (not shown) can store a selected volume of liquid coolant that might leak from the primary flow path 217 before a technician can replace the heat exchanger 200.

Referring again to FIGS. 3 and 5, the heat sink 210 can define a lower-most face 211 of the heat exchanger 200, as well as a surface configured to thermally couple to an integrated circuit (IC) package (not shown). A retention mechanism (not shown) can mechanically couple the assembly to a substrate, such as a printed circuit board to which the IC package is assembled.

A peripheral channel 250 can extend at least partially around a selected region 211 of the first major surface 213 of the heat sink 210 configured to be placed into thermal contact with a heat-dissipation component (not shown). A liquid-detection sensor 260 can be positioned in the peripheral channel 250. The liquid-detection sensor 260 can extend at least partially around the region 211 of the first major surface 213 of the heat sink. For example, in FIGS. 2 through 5, the liquid-detection sensor 260 extends substantially entirely around the region 211.

However, in another embodiment, the liquid-detection sensor 260, can merely extend adjacent the region 211, e.g., along one side 218 of the region. For example, a secondary flow path 216 through the interface region 240 can define an internal passageway that has a plurality of branches originating at selected intervals around the primary flow path 217 through the heat exchanger 200. Each originating branch can merge with one or more other originating branches to define one or more corresponding merged channels, as with the branched flow path 216 shown in FIG. 4. The merged channel(s), in turn, can extend toward the peripheral channel 250 positioned adjacent the region 211. Although the peripheral channel 250 is illustrated in FIGS. 4 and 5 extending substantially around a periphery 219 of the heat sink 210, the peripheral channel 250 can merely extend adjacent the region 211, e.g., along one side 218 of the region. With such a truncated peripheral channel, a leak-detection sensor 260 also can be truncated in length and be positioned to extend adjacent the region, as described in relation to the channel 250.

In the embodiment shown in FIGS. 2 through 5, 7 and 9, the housing 220 defines the peripheral channel 250. In another embodiment, the heat sink 210 defines the peripheral channel 250. For example, the heat sink 210 can define a recess from the first major surface 212 and the recess can extend adjacent to or around a region of the first major surface contemplated to be placed into thermal contact with a heat-dissipation component. In yet another embodiment, the heat sink 219 defines a portion of the channel 250 and the housing 220 defines a complementary portion of the channel 250.

Regardless of whether the housing 210, the heat sink 220, or both, defines it, a peripheral channel 250, as in FIG. 5, can define a peripherally extending, open face 251. A cover 270 can be positioned in an overlying relation with the open face 251, as to close the open face, enclosing the peripheral channel 250. In FIGS. 4 and 5, the cover 270 is substantially planar and defines opposed first and second major surfaces 272, 274. The first major surface 272 of the cover 270 is positioned in an opposed relationship with the first major surface 212 of the heat sink 210 and extends across the open face 251 of the peripheral channel 250. The first major surface 272 of the cover 270 can be sealably affixed with a corresponding region of the first major surface 212 of the heat sink 210, as well as a corresponding region of the housing 220, as the cover spans across the gap of the open face 251 of the peripheral channel 250. For example, the cover can be a sheet of mylar (e.g., polyimide) or other electrically insulative material. The cover 270 can be adhesively attached to the heat sink 210, the housing 220, or both, to form a water-resistant boundary adjacent the open face 251.

The illustrated cover 270 defines an aperture 273 extending around the region 211 of the first major surface 212 configured to be placed into thermal contact with a heat-dissipation component (not shown). Such an arrangement allows the cover 270 to span across the open face 251 without being positioned between a heat-dissipation component and the heat sink, e.g., without inhibiting conduction heat transfer from the heat-dissipation component to the heat sink.

Although the cover 270 is described above and shown in the drawings as overlying an open face 251 of a channel that extends around a periphery of the contact region 211 of the heat sink 210, a similar cover can be incorporated in an embodiment having a "truncated" channel extending adjacent a selected side of the contact region. Moreover, although the cover 270 shown in FIGS. 4 and 5 defines an aperture 273 extending around the contact region 211 of the heat sink 210, a cover for a "truncated" channel extending adjacent the contact region need not define an aperture. For example, a cover spanning across an open face 251 of a shortened peripheral channel 250 may not extend over any portion of a heat sink contemplated to contact a heat-dissipation component. In another embodiment, such a cover may define a recess or "cutout" that partially extends around a portion of a heat sink contemplated to contact the heat-dissipation component.

Referring still to FIG. 5, the liquid-cooled heat exchanger 200 can define an outer peripheral wall 253 positioned laterally outward of the peripheral channel 250. The outer peripheral wall 253 can extend in a transverse direction relative to a plane defined by the first major surface 212 of the heat sink 210, despite that the outer peripheral wall 253 may be positioned laterally outward of the heat sink 210, as in FIGS. 7 and 8. As shown by way of example in FIGS. 7 and 8, the outer peripheral wall 253 need not intersect with a plane defined by the first major surface 212.

Figure 2:
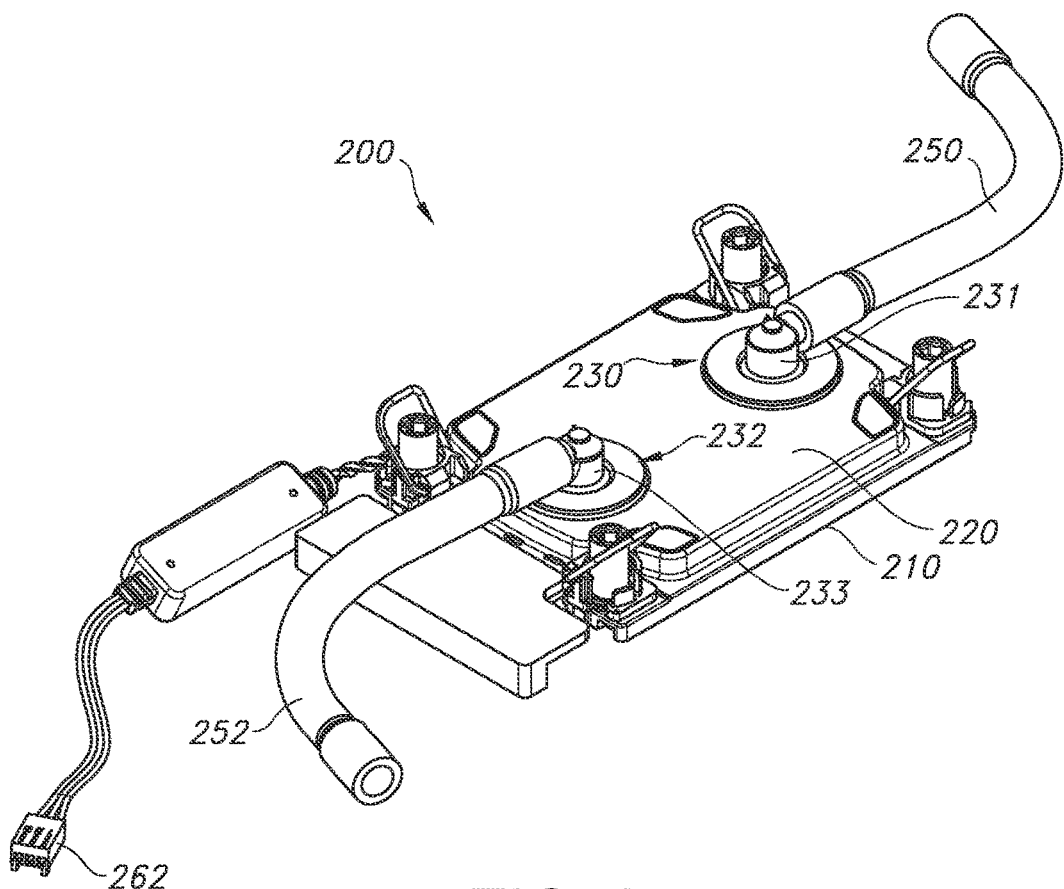
FIG. 2 shows an isometric view from above a passive, liquid-cooled heat exchanger incorporating a leak-detection sensor.
Figure 3:
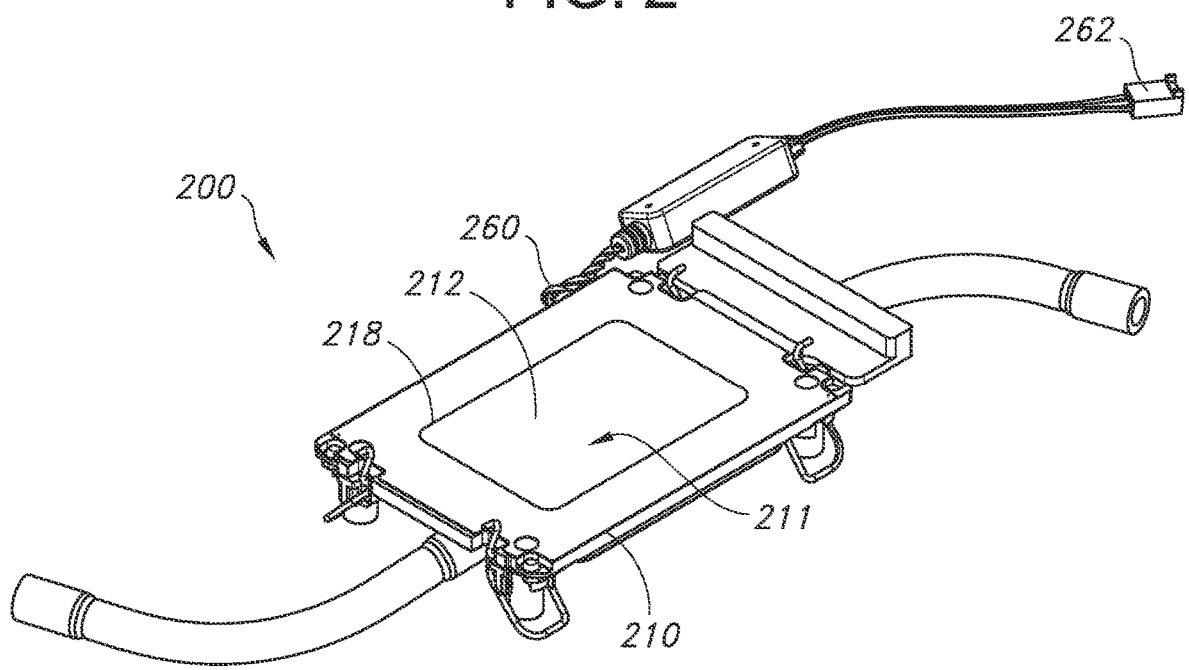
FIG. 3 shows an isometric view from below the heat exchanger shown in FIG. 2.

In the embodiment depicted in FIGS. 4 and 5, the outer peripheral wall 253 defines a corresponding outer surface. A secondary channel 252 extends from the outer surface of the outer peripheral wall 253 to the peripherally extending channel 250. The secondary channel 252 permits a segment 261 of (or other electrical conductor associated with) the liquid-detection sensor 260 to extend laterally outward of the peripherally extending channel, e.g., through the secondary channel 252. In some embodiments, a grommet (not shown) can be positioned within the secondary channel 252. For example, the segment 261 can extend outward of the heat exchanger 200, e.g., from the secondary channel 252, through the grommet, and externally of the liquid-cooled heat exchanger (e.g., as shown in FIGS. 2 and 3). As also shown, an electrical connector 262 can be electrically coupled with the segment 261. The electrical connector 262 can be configured to matingly engage with a correspondingly configured electrical connector (not shown) to provide an input to a computing environment. For example, the correspondingly configured electrical connector can be a fan header coupled with a communication bus.

Figure 9:
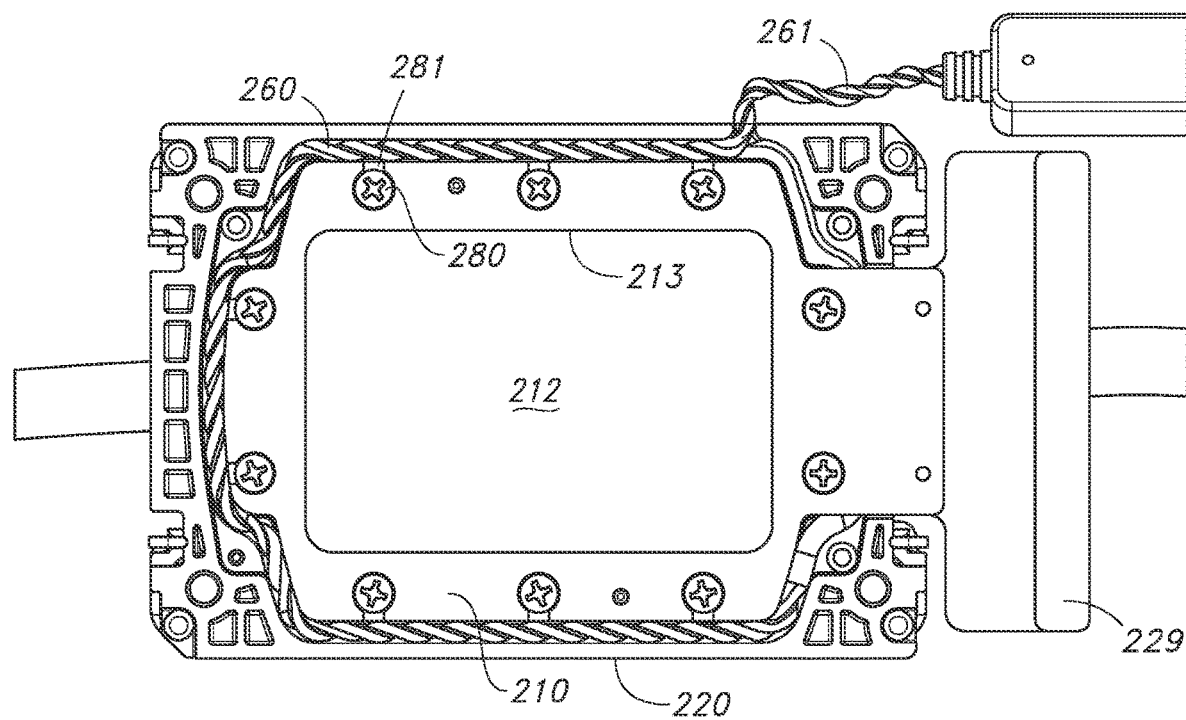
FIG. 9 illustrates a plan view from below a passive heat exchanger, similar to the heat exchanger shown in FIG. 2.

Referring still to FIGS. 4 and 5, the heat sink 210 can be attached to the housing 220 by screws 280 or other fasteners. The first major surface 212 of the heat sink 210 can be counter-sunk to receive a head of the screw, e.g., to prevent the head from extending "above" the surface 212. Seepage of liquid coolant that enters the interface 240 between the heat sink and the housing can pass along one or more of the screws 280 (e.g., as indicated by the arrows in the cross-sectional view in FIG. 8). As FIG. 9 shows, the surface 212 of the heat sink 210 can define a recessed channel 281 extending from the aperture 282 that receives the screw 280 to an outer periphery of the heat sink 210. The recessed channel 281 can direct a secondary flow of liquid coolant that passes along the screw 280 to the channel 250 and the leak-detection sensor 260, while inhibiting or preventing leakage or seepage of the liquid out of the heat exchanger 200. For example, the cover 270 can extend over the open face of the channel 281 to close the open face and define a boundary of the secondary flow path.

Also shown in FIG. 9 is an accessory cooling region 229 extending from the heat sink 210. The accessory cooling region 229, in the illustrated heat sink embodiment, is a cantilevered member forming a unitary construction with the region of the heat sink configured to be placed into thermal contact with a heat-dissipation component. In FIG. 9, the optional accessory region 229 is configured to be placed into thermal contact with a bank of voltage-regulation components, while the region 212 is configured to be placed into thermal contact with a package of a processing unit. By integrating the accessory region 229, cooling of the accessory components (in this instance voltage-regulation components) can be facilitated in combination with cooling of a processing unit.

III. LEAK SENSORS

A leak-detection sensor, or more generally, a leak detector circuit can be configured to respond to a leak (e.g., moisture or another selected proxy for a leak) of a working fluid (e.g., a liquid coolant) detected by a sensitive region. Principles relating to and embodiments of leak-detection sensors and leak detector circuits are described, for example, in U.S. Pat. No. 9,052,252, issued Jun. 9, 2015, and in U.S. application Ser. No. 14/777,510, filed on Mar. 14, 2014, the disclosures of which patent and application are hereby incorporated by reference in their entirety as if fully reproduced herein, for all purposes.

By way of example, a leak detector circuit can be configured to emit a first waveform in the absence of a detected leak and to emit a second waveform responsive to a detected leak. Any suitable sensor configured to detect a leak (or other proxy for a leak, e.g., moisture, presence of a working fluid at a position external to a heat-transfer system, a low pressure in the heat-transfer system, a low fluid level in the heat-transfer system) can be used in connection with such an electrical circuit.

Figure 10:
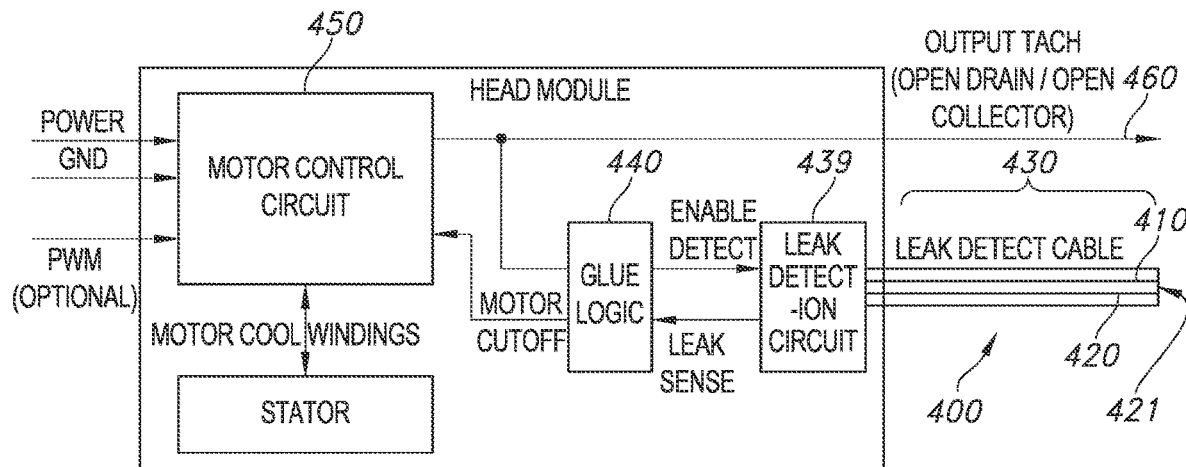
FIG. 10 shows a block diagram of a leak-detection sensor and a portion of an associated control system in relation to a fluid heat exchange system, such as, for example, a fluid circuit as in FIG. 1, a passive heat exchanger, as in FIG. 2, and/or an active heat exchanger as in FIG. 6.

As but one of many possible examples of leak-detection sensors, a leak-detection sensor is shown in FIG. 10. The leak-detection sensor 400 can have a first leak-detection wire 410 and a second leak-detection wire 420. The first and the second leak-detection wires 410, 420 can comprise respective exposed traces on a printed circuit board, e.g., a flexible circuit board. Alternatively, the leak-detection wires can be twisted (e.g., helically twisted) together, with an electrically insulating material positioned between them, as to prevent direct contact between the wires.

The leak-detection sensor 260 in FIGS. 2 through 5 and 7 through 9 is an example of such a twisted leak-detection sensor. As shown in FIGS. 7 and 8, the leak-detection sensor 260 has first and second wires 263, 264, similar in principle to the wires 410, 420.

Referring again to FIG. 10, a first leak-detection wire 410 can electrically couple with a power plane or other signal source. A second leak-detection wire 420 can extend generally parallel to and spaced apart from the first leak-detection wire 410. A region 430 along which the first and the second wires 410, 420 are coextensive can define a leak-sensitive region of the sensor 400. With respect to the embodiment in FIGS. 2 through 5, the leak-sensitive region of the sensor 260 can extend around or adjacent the region 211 of the heat sink 210 contemplated to be placed into thermal contact with a heat-dissipation component.

A leak can be detected when an open circuit between the first and the second leak-detection wires 410, 420 is closed. For example, a leaked liquid can span a gap 421 between the first and the second leak-detection wires 410, 420 within the leak-sensitive region 430 of the sensor 400, electrically coupling the first and the second leak-detection wires to each other.

When the circuit between such first and second leak-detection wires 410, 420 is closed, the circuit of the leak detector 400 can emit a corresponding signal indicative of a detected leak. For example, when the first and the second leak-detection wires 410, 420 shown in FIG. 10 are electrically coupled to each other, the second leak-detection wire 420 can be pulled high (e.g., can have a voltage potential corresponding to the voltage of the power plane or other signal source). In an embodiment, pulling the second leak-detection wire 420 high can output a signal ("leak sense" in FIG. 10). Such a signal or other circuitry ("glue logic") 440 can activate a relay or other device, as for example to interrupt power to a pump, or to power an actuator configured to fluidly isolate a fluid device from a fluid circuit, or otherwise provide a signal to a control circuit 450. The control circuit 450 can control a motor of a fan or a pump, or can actuate an actuator to interrupt a flow of fluid, as by closing a valve. The circuit 450 can also output a signal 460 to communicate a presence of a detected leak to a computing environment or other monitoring system. Examples of such actuators are described by way of example in U.S. patent application Ser. No. 15/354,982, filed Nov. 17, 2016, and U.S. Pat. App. No. 62/794,458, filed Jan. 18, 2019.

As well, or alternatively, pulling the second leak-detection wire 420 high can serve as a signal to a monitoring system that a leak has been detected. Further, such a leak-detection sensor can have an address (or a channel of the monitoring system to which the leak-detection sensor is connected can have an address). The address can correspond to a physical location in a cooling system or a server system. For example, the address can correspond to a particular computing device within a particular server mounted in a particular server rack within a given data center or network of data centers. The monitoring system can in response initiate an alert or a system command, and the alert or system command can identify the physical location where a leak was detected, facilitating a prompt response by a technician.

Referring still to FIG. 10, a leak detection sensor 400 is schematically illustrated as extending from an active liquid-cooled heat exchanger (sometimes referred to in the art as a "Head Module"). Nonetheless, the leak detection sensor 400 and the associated circuitry and logic can be incorporated in a passive, liquid-cooled heat exchanger as described above. The motor cutoff signal in a passive heat exchanger, however, may be routed at least partly externally of the heat exchanger, as a passive heat exchanger does not incorporate a motor. The leak detection sensor 400 shown in FIG. 10 has first and second leak-detection wires 410, 420 spaced apart from each other to form a gap 421. Such a leak detection sensor is sometimes referred to in the art as a "Leak Detect Cable." One or both of the leak-detection wires 410, 420 can but need not be be partially or fully embedded (or otherwise surrounded by) a semi-conducting carrier. The first and/or the second leak-detection wires 410, 420 can be formed from an alloy of copper.

A conductive fluid spanning the gap 421 between the first and second leak-detection wires 410, 420 can provide a "non-trivial" resistance between the first and the second leak-detection wires. As used herein, a "non-trivial resistance" means a finite resistance sufficient to electrically couple the first and the second leak-detection wires to each other when exposed to a voltage potential above a selected threshold voltage. With a circuit configured as shown in FIG. 10, a non-trivial resistance between the first and the second leak-detection wires can supply the analog Leak Sense line 422 with a non-zero voltage.

As indicated in FIG. 10, some leak detectors can have a functional module 440 (sometimes referred to in the art as a "Glue Module") configured to respond to a leak detected by a leak detection sensor 400. In some embodiments, the Glue Logic module is configured to monitor the Leak Sense line 422 continuously. In other embodiments, the Glue Logic module is configured to sample the Leak Sense line 422 at defined times (e.g., at selected intervals, or at selected intermittent times). The Glue Logic can also be configured to transmit a signal over an Enable Detect line, and, as shown by way of example in FIG. 10, the Leak Detection Circuit 430 can be configured to become operative in response to a signal received over the Enable Detect line.

A Glue Logic module 440 can be configured to interrupt operation of a pump motor responsive to a signal received over the Leak Sense line indicative of the existence of a leak (e.g., an electrical coupling between the first and the second leak-detection wires). For example, a Motor Cutoff line can carry a signal emitted by the Glue Logic, and a Motor Control Circuit 450 can respond to a signal received over the Motor Cutoff line by interrupting power to a motor. Alternatively (or additionally), the Glue Logic can force an output tachometer signal 460 from the heat exchanger (active or passive) to a selected value, e.g., logic 0 (e.g., low logic) to signify to a monitoring system that there has been a failure associated with the heat exchanger.

Many other leak-detection sensor and leak detector circuit configurations are possible. As but several examples, such sensors can include a capacitive moisture sensor, an optical sensor, an infrared sensor, a pressure sensor configured to observe a pressure within the heat-transfer system, a sensor configured to detect a low fluid level in the heat-transfer system, and other sensors now known and hereafter developed.

Some leak detectors can have an electrical circuit configured, in the absence of a detected leak, to emit a simulated tachometer signal having a waveform similar to a waveform emitted by a properly operating fan or pump. The electrical circuit can be further configured to emit a simulated tachometer signal having a waveform similar to a failed or failing fan or pump in response to a detected leak of a liquid

IV. COMPUTING ENVIRONMENTS

Disclosed controllers can be embodied in software, firmware or hardware (e.g., an ASIC). A control unit processor may be a special purpose processor such as an application specific integrated circuit (ASIC), a general purpose microprocessor, a field-programmable gate array (FPGA), a digital signal controller, or a set of hardware logic structures (e.g., filters, arithmetic logic units, and dedicated state machines), and can be implemented in a general computing environment as described herein.

Figure 11:
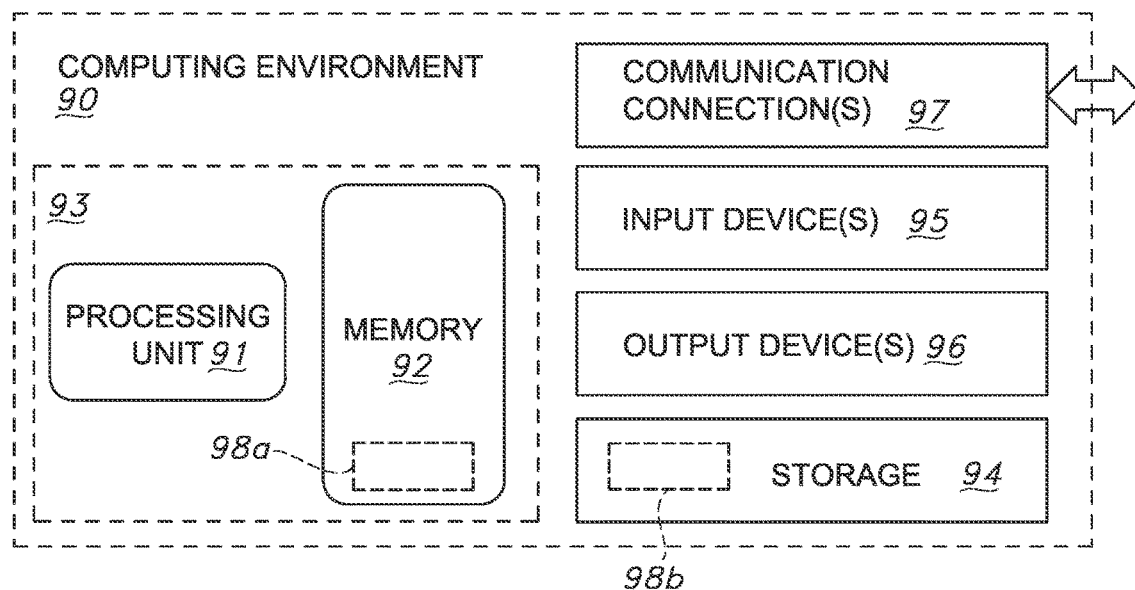
FIG. 11 shows a block diagram of a computing environment suitable for implementing disclosed technologies.

FIG. 11 illustrates a generalized example of a suitable computing environment 90 in which described methods, embodiments, techniques, and technologies relating, for example, to maintaining a temperature of a logic component and/or a power unit below a threshold temperature can be implemented. The computing environment 90 is not intended to suggest any limitation as to scope of use or functionality of the technologies disclosed herein, as each technology may be implemented in diverse general-purpose or special-purpose computing environments. For example, each disclosed technology may be implemented with other computer system configurations, including wearable and/or handheld devices (e.g., a mobile-communications device), multiprocessor systems, microprocessor-based or programmable consumer electronics, embedded platforms, network computers, minicomputers, mainframe computers, smartphones, tablet computers, data centers, audio appliances, and the like. Each disclosed technology may also be practiced in distributed computing environments where tasks are performed by remote processing devices that are linked through a communications connection or network. In a distributed computing environment, program modules may be located in both local and remote memory storage devices.

The computing environment 90 includes at least one central processing unit 91 and a memory 92. In FIG. 11, this most basic configuration 93 is included within a dashed line. The central processing unit 91 executes computer-executable instructions and may be a real or a virtual processor. In a multi-processing system, or in a multi-core central processing unit, multiple processing units execute computer-executable instructions (e.g., threads) to increase processing speed and as such, multiple processors can run simultaneously, despite the processing unit 91 being represented by a single functional block. A processing unit can include an application specific integrated circuit (ASIC), a general purpose microprocessor, a field-programmable gate array (FPGA), a digital signal controller, or a set of hardware logic structures arranged to process instructions.

The memory 92 may be volatile memory (e.g., registers, cache, RAM), non-volatile memory (e.g., ROM, EEPROM, flash memory, etc.), or some combination of the two. The memory 92 stores software 98a that can, for example, implement one or more of the technologies described herein, when executed by a processor.

A computing environment may have additional features. For example, the computing environment 90 includes storage 94, one or more input devices 95, one or more output devices 96, and one or more communication connections 97. An interconnection mechanism (not shown) such as a bus, a controller, or a network, interconnects the components of the computing environment 90. Typically, operating system software (not shown) provides an operating environment for other software executing in the computing environment 90, and coordinates activities of the components of the computing environment 90.

The store 94 may be removable or non-removable, and can include selected forms of machine-readable media. In general machine-readable media includes magnetic disks, magnetic tapes or cassettes, non-volatile solid-state memory, CD-ROMs, CD-RWs, DVDs, magnetic tape, optical data storage devices, and carrier waves, or any other machine-readable medium which can be used to store information and which can be accessed within the computing environment 90. The storage 94 can store instructions for the software 98b, which can implement technologies described herein.

The store 94 can also be distributed over a network so that software instructions are stored and executed in a distributed fashion. In other embodiments, some of these operations might be performed by specific hardware components that contain hardwired logic. Those operations might alternatively be performed by any combination of programmed data processing components and fixed hardwired circuit components.

The input device(s) 95 may be any one or more of the following: a touch input device, such as a keyboard, keypad, mouse, pen, touchscreen, touch pad, or trackball; a voice input device, such as a microphone transducer, speech-recognition software and processors; a scanning device; or another device, that provides input to the computing environment 90. For audio, the input device(s) 95 may include a microphone or other transducer (e.g., a sound card or similar device that accepts audio input in analog or digital form), or a computer-readable media reader that provides audio samples to the computing environment 90.

The output device(s) 96 may be any one or more of a display, printer, loudspeaker transducer, DVD-writer, or another device that provides output from the computing environment 90.

The communication connection(s) 97 enable communication over or through a communication medium (e.g., a connecting network) to another computing entity. A communication connection can include a transmitter and a receiver suitable for communicating over a local area network (LAN), a wide area network (WAN) connection, or both. LAN and WAN connections can be facilitated by a wired connection or a wireless connection. If a LAN or a WAN connection is wireless, the communication connection can include one or more antennas or antenna arrays. The communication medium conveys information such as computer-executable instructions, compressed graphics information, processed signal information (including processed audio signals), or other data in a modulated data signal. Examples of communication media for so-called wired connections include fiber-optic cables and copper wires. Communication media for wireless communications can include electromagnetic radiation within one or more selected frequency bands.

Machine-readable media are any available media that can be accessed within a computing environment 90. By way of example, and not limitation, with the computing environment 90, machine-readable media include memory 92, storage 94, communication media (not shown), and combinations of any of the above. Tangible machine-readable (or computer-readable) media exclude transitory signals.

As explained above, some disclosed principles can be embodied in a tangible, non-transitory machine-readable medium (such as microelectronic memory) having stored thereon instructions. The instructions can program one or more data processing components (generically referred to here as a "processor") to perform a processing operations described above, including estimating, computing, calculating, measuring, adjusting, sensing, measuring, filtering, addition, subtraction, inversion, comparisons, and decision making (such as by the control unit 52). In other embodiments, some of these operations (of a machine process) might be performed by specific electronic hardware components that contain hardwired logic (e.g., dedicated digital filter blocks). Those operations might alternatively be performed by any combination of programmed data processing components and fixed hardwired circuit components.

For sake of brevity throughout this disclosure, computing-environment components, processors, interconnections, features, devices, and media are generally referred to herein, individually, as a "logic component."

V. OTHER EMBODIMENTS

The examples described above generally concern apparatus, methods, and related systems to detect seepage or leakage of a liquid coolant from an active or a passive, liquid-cooled heat exchanger. More particularly, but not exclusively, disclosed principles pertain to systems, methods, and components to incorporate leak-detection capabilities in such a heat exchanger.

Certain examples described herein generally concern control systems, with specific examples of control systems being configured to respond to a detected condition or operational state of a liquid-based heat-transfer system, e.g., to issue an alert or other command responsive to a detected leak of a working fluid or to issue an alert or other command responsive to an observed flow rate of a working fluid. As but one example, a pump speed can be adjusted responsive to a signal emitted by a flow-rate sensor. The signal can be indicative of an observed flow rate of working fluid (or an indicia thereof, by way of example, a rotational speed of a rotational member within a segment of conduit).

Other embodiments of heat exchanges incorporating leak-detection sensors, and other embodiments of leak detectors, methods, circuits and/or control systems, than those described above in detail are contemplated based on the principles disclosed herein, together with any attendant changes in configurations of the respective apparatus and/or circuits described herein. Incorporating the principles disclosed herein, it is possible to provide a wide variety of heat exchangers and control systems configured to issue an alert or other command, and/or, based on a detected change in state or operation (e.g., a detected leak or change in observed flow rate), to adjust an operation of a wide variety of systems, including by way of example, a heat-transfer system for any of a data center, a laser component, a light-emitting diode, a chemical reactor, photovoltaic cells, solar collectors, and a variety of other industrial, military and consumer devices now known and hereafter developed. Moreover, systems disclosed above can be used in combination with other liquid-based systems including, inter alia, reactor vessels.

Nonetheless, the previous description is provided to enable a person skilled in the art to make or use the disclosed principles. Embodiments other than those described above in detail are contemplated based on the principles disclosed herein, together with any attendant changes in configurations of the respective apparatus or changes in order of method acts described herein, without departing from the spirit or scope of this disclosure. Various modifications to the examples described herein will be readily apparent to those skilled in the art.

Directions and other relative references (e.g., up, down, top, bottom, left, right, rearward, forward, etc.) may be used to facilitate discussion of the drawings and principles herein, but are not intended to be limiting. For example, certain terms may be used such as "up," "down,", "upper," "lower," "horizontal," "vertical," "left," "right," and the like. Such terms are used, where applicable, to provide some clarity of description when dealing with relative relationships, particularly with respect to the illustrated embodiments. Such terms are not, however, intended to imply absolute relationships, positions, and/or orientations. For example, with respect to an object, an "upper" surface can become a "lower" surface simply by turning the object over. Nevertheless, it is still the same surface and the object remains the same. As used herein, "and/or" means "and" or "or", as well as "and" and "or." Moreover, all patent and non-patent literature cited herein is hereby incorporated by reference in its entirety for all purposes.

And, those of ordinary skill in the art will appreciate that the exemplary embodiments disclosed herein can be adapted to various configurations and/or uses without departing from the disclosed principles. For example, the principles described above in connection with any particular example can be combined with the principles described in connection with another example described herein. Thus, all structural and functional equivalents to the features and method acts of the various embodiments described throughout the disclosure that are known or later come to be known to those of ordinary skill in the art are intended to be encompassed by the principles described and the features and acts claimed herein. Accordingly, neither the claims nor this detailed description shall be construed in a limiting sense.

Moreover, nothing disclosed herein is intended to be dedicated to the public regardless of whether such disclosure is explicitly recited in the claims. No claim feature is to be construed under the provisions of 35 USC 112(f), unless the feature is expressly recited using the phrase "means for" or "step for".

The appended claims are not intended to be limited to the embodiments shown herein, but are to be accorded the full scope consistent with the language of the claims, wherein reference to a feature in the singular, such as by use of the article "a" or "an" is not intended to mean "one and only one" unless specifically so stated, but rather "one or more". Further, in view of the many possible embodiments to which the disclosed principles can be applied, we reserve the right to claim any and all combinations of features and technologies described herein as understood by a person of ordinary skill in the art, including the right to claim, for example, all that comes within the scope and spirit of the foregoing description, as well as the combinations recited, literally and equivalently, in any claims presented anytime throughout prosecution of this application or any application claiming benefit of or priority from this application, and more particularly but not exclusively in the claims appended hereto.

We currently claim:

1. A liquid-cooled heat exchanger configured to cool a heat-dissipation component by transferring heat dissipated by the heat-dissipation component to a liquid coolant in the heat exchanger, the heat exchanger comprising:
   a heat sink having a first major surface defining a region configured to be placed into thermal contact with a corresponding surface of a heat-dissipation component, wherein such thermal contact conductively transfers heat from the heat-dissipation component to the heat sink, wherein the heat sink has a second major surface positioned opposite the first major surface;
   a housing assembly coupled with the heat sink, defining an internal passageway configured to direct a flow of liquid coolant over the second major surface of the heat sink, wherein such flow of liquid coolant convectively transfers heat from the heat sink to the liquid coolant;
   a peripheral channel extending at least partially around the region of the first major surface configured to be placed into thermal contact with the heat-dissipation component; and
   a liquid-detection sensor positioned in the peripheral channel.

* * * * *